US012278346B2

(12) United States Patent
Kuranuki et al.

(10) Patent No.: US 12,278,346 B2
(45) Date of Patent: Apr. 15, 2025

(54) ELECTRICITY STORAGE PACK, ELECTRIC MOBILE BODY, AND CHARGING DEVICE

(71) Applicant: Panasonic Intellectual Property Management Co., Ltd., Osaka (JP)

(72) Inventors: Masaaki Kuranuki, Kyoto (JP); Katsuaki Hamamoto, Osaka (JP); Ryosuke Nagase, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 421 days.

(21) Appl. No.: 17/907,266

(22) PCT Filed: Mar. 18, 2021

(86) PCT No.: PCT/JP2021/010998
§ 371 (c)(1),
(2) Date: Sep. 25, 2022

(87) PCT Pub. No.: WO2021/200196
PCT Pub. Date: Oct. 7, 2021

(65) Prior Publication Data
US 2023/0095740 A1    Mar. 30, 2023

(30) Foreign Application Priority Data
Apr. 1, 2020    (JP) .................................. 2020-066046

(51) Int. Cl.
*H01M 10/42*    (2006.01)
*B60L 50/64*    (2019.01)
(Continued)

(52) U.S. Cl.
CPC .......... *H01M 10/425* (2013.01); *B60L 50/64* (2019.02); *B60L 53/66* (2019.02); *G01R 27/08* (2013.01);
(Continued)

(58) Field of Classification Search
None
See application file for complete search history.

(56) References Cited

U.S. PATENT DOCUMENTS

2014/0340092 A1    11/2014    Kim et al.
2015/0272575 A1    10/2015    Leimbach et al.
(Continued)

FOREIGN PATENT DOCUMENTS

CN    108370072 A    8/2018
JP    6-284594    10/1994

OTHER PUBLICATIONS

International Search Report of PCT application No. PCT/JP2021/010998 dated Jun. 22, 2021.
(Continued)

*Primary Examiner* — Wyatt P McConnell
(74) *Attorney, Agent, or Firm* — Rimon P.C.

(57) ABSTRACT

Controller of power storage pack performs communication for authentication with controller of an electric moving body according to the pattern of a current flowing through a power line in a state where power storage pack is mounted to electric moving body. Controller of power storage pack measures contact resistance between power storage pack and the electric moving body based on voltage of the power line on power storage pack side, voltage of the power line on the electric moving body side received from controller of the electric moving body, and current when communication for authentication is performed according to the pattern of a current flowing through the power line.

17 Claims, 9 Drawing Sheets

(51) Int. Cl.
| | |
|---|---|
| *B60L 53/66* | (2019.01) |
| *G01R 27/08* | (2006.01) |
| *H01M 10/0525* | (2010.01) |
| *H01M 10/46* | (2006.01) |
| *H01M 10/48* | (2006.01) |
| *H01M 50/204* | (2021.01) |
| *H01M 50/249* | (2021.01) |
| *H02J 7/00* | (2006.01) |
| *B62J 43/16* | (2020.01) |

(52) U.S. Cl.
CPC ....... *H01M 10/0525* (2013.01); *H01M 10/46* (2013.01); *H01M 10/482* (2013.01); *H01M 50/204* (2021.01); *H01M 50/249* (2021.01); *H02J 7/00045* (2020.01); *H02J 7/0045* (2013.01); *H02J 7/0063* (2013.01); *B62J 43/16* (2020.02); *H01M 2010/4271* (2013.01); *H01M 2220/20* (2013.01)

(56) References Cited

U.S. PATENT DOCUMENTS

2016/0106424 A1    4/2016  Yates et al.
2018/0310933 A1*  11/2018  Yates .................. H01M 10/425

OTHER PUBLICATIONS

The EPC Office Action dated Aug. 28, 2023 for the related European Patent Application No. 21780213.1.
English Translation of Chinese Search Report dated Jan. 9, 2025 for the related Chinese Patent Application No. 202180025109.9.

* cited by examiner

ELECTRICITY STORAGE PACK, ELECTRIC MOBILE BODY, AND CHARGING DEVICE

TECHNICAL FIELD

The present disclosure relates to a power storage pack capable of being mounted to and unmounted from an electric moving body, an electric moving body, and a charging device.

BACKGROUND ART

In recent years, electric motorcycles (electric scooters) and electric bicycles have become widespread. Usually, a portable battery pack capable of being mounted and unmounted is used in the electric motorcycle or the electric bicycle. When a battery is used as a power source of the motorcycle (scooter), a time required for energy supply is longer than that in a case where a liquid fuel such as gasoline is used (a charging time is longer than a fueling time).

Then, it is considered to construct a mechanism for shortening the time required for energy supply by exchanging a battery pack charged in advance with a battery pack having reduced remaining capacity at the nearest charging stand when the remaining capacity of the battery pack decreases.

In order to reduce the number of terminals of the battery pack, it is conceivable to transmit and receive control signals between the battery pack and the vehicle or the charger by wireless communication. In the above mechanism involving exchange of the battery pack, when a battery pack that transmits and receives control signals by wireless communication is used, a circumstance where a plurality of vehicles or a plurality of chargers exist in a range where wireless communication with the battery pack is possible can occur.

Under such a circumstance, there is a possibility that a controller of a certain vehicle erroneously controls a battery pack mounted into another adjacent vehicle. There is a possibility that a controller of a charger does not control a battery pack that is supposed to be controlled and is mounted into a certain charging slot but erroneously controls a battery pack that is not supposed to be controlled and is mounted into another charging slot. In such a case, safety and security of the entire charging system cannot be secured.

Therefore, the inventors of the present invention have developed a method of correctly identifying a battery pack mounted to a vehicle or a charging device by transmitting identification information from the vehicle or the charging device to the battery pack using a pattern of a current flowing through a power line, and looping back the identification information from the battery pack to the vehicle or the charging device by wireless communication.

PTL 1 discloses a technique of removing a current sensing resistor by performing overcurrent detection using a reference voltage circuit equal to a product of an ON resistance of a switch circuit connected between a secondary battery and an external power source terminal and an overcurrent value. This technique is not overcurrent protection in an authentication process at the time of mounting a battery pack.

CITATION LIST

Patent Literature

PTL 1: Unexamined Japanese Patent Publication No. H6-284594

SUMMARY OF THE INVENTION

The present disclosure has been made in view of such a circumstance, and an object of the present disclosure is to provide a technique for efficiently measuring contact resistance between an electric moving body and a charging device after an electric power storage pack is mounted on the electric moving body or the charging device.

In order to solve the above problems, a power storage pack according to an aspect of the present disclosure includes: a power storage unit for supplying power to an electric moving body; and a controller that performs communication for authentication according to a pattern of a current flowing through a power line with a controller of the electric moving body in a state where the power storage pack is mounted to the electric moving body. A controller of the power storage pack measures contact resistance between the power storage pack and the electric moving body based on voltage of the power line on the power storage pack side, voltage of the power line on the electric moving body side received from a controller of the electric moving body, and current at the time of performing communication for authentication based on a pattern of current flowing through the power line.

According to the present disclosure, after mounting a power storage pack to an electric moving body or a charging device, it is possible to efficiently measure contact resistance between the electric moving body and the charging device.

DESCRIPTION OF EMBODIMENT

Figure 1:
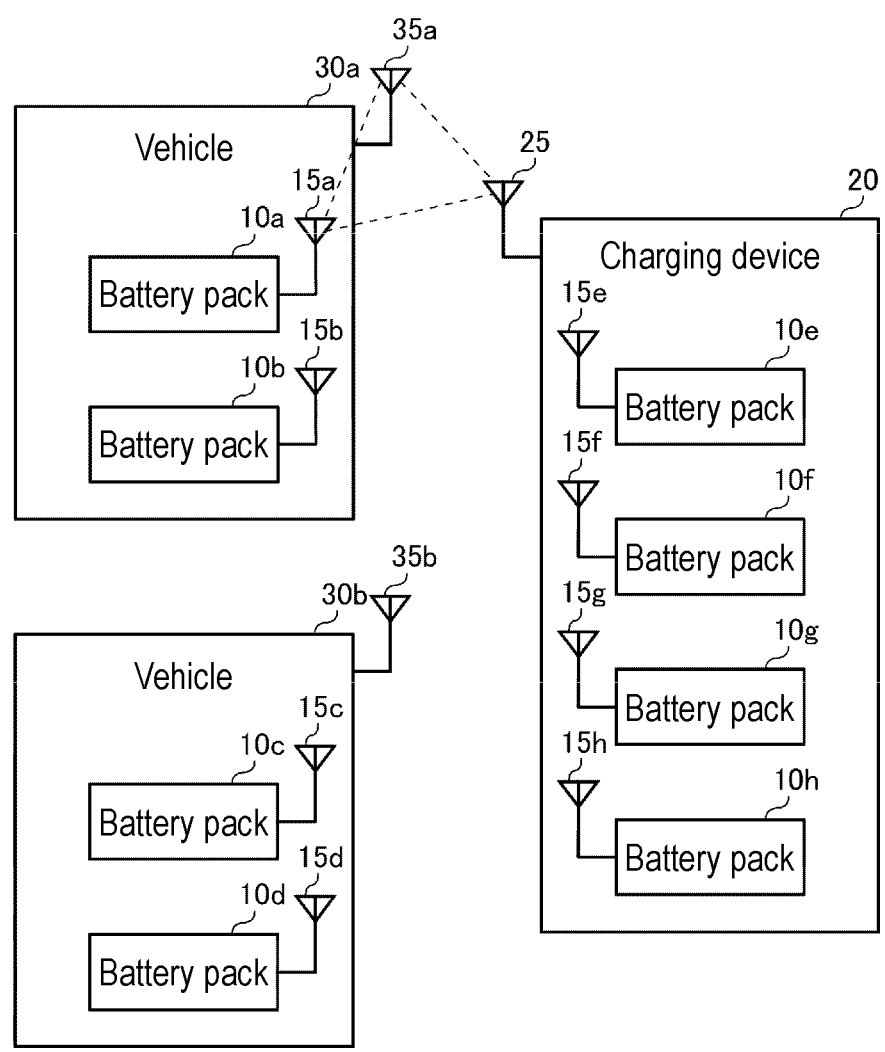
FIG. 1 is a conceptual diagram of a vehicle system using an exchangeable battery pack according to an exemplary embodiment.

FIG. 1 is a conceptual diagram of vehicle system 1 using exchangeable battery pack 10 according to an exemplary embodiment. In vehicle system 1, a plurality of battery packs 10, at least one charging device 20, and a plurality of vehicles 30 are used. In the present exemplary embodiment, an electric motorcycle (electric scooter) is assumed as vehicle 30.

Battery pack 10 is a portable or exchangeable battery pack capable of being mounted and unmounted, and can be mounted into a mounting slot of vehicle 30 and a charging slot of charging device 20. Battery pack 10 is charged in a state of being mounted into the charging slot of charging device 20. Charged battery pack 10 is taken out by a user (usually, a driver of vehicle 30) and is mounted into the mounting slot of vehicle 30. Battery pack 10 mounted into the mounting slot of vehicle 30 discharges during travelling of vehicle 30, and a remaining capacity is reduced with the discharge. Battery pack 10 having the reduced remaining capacity is taken out by the user and is mounted into the charging slot of charging device 20. The user takes out charged battery pack 10 from another charging slot of charging device 20 and mounts the charged battery pack into the mounting slot of vehicle 30. By this work, battery pack 10 having the reduced remaining capacity is exchanged with charged battery pack 10. Due to this, the user does not need to wait while battery pack 10 is charged, and can resume travelling of vehicle 30 in a short time.

In this method, since the mounting and unmounting of battery pack 10 frequently occur, degradation of a connector part of battery pack 10 coming into contact with a connector part of the mounting slot of vehicle 30 or a connector part of the charging slot of charging device 20 easily progresses. As a countermeasure against this, in the present exemplary embodiment, transmission and reception of control signals between vehicle 30 or charging device 20 and battery pack 10 by wireless communication. This can eliminate a terminal for a communication line from a connector. It is sufficient to provide a terminal for a power line in the connector. In the present exemplary embodiment, since wired communication via a connector is not used for the transmission and reception of control signals, it is possible to prevent control signals from being interrupted due to connector failure.

Near-field communication is used for wireless communication between vehicle 30 and battery pack 10, wireless communication between charging device 20 and battery pack 10, and wireless communication between vehicle 30 and charging device 20. Bluetooth (registered trademark), Wi-Fi (registered trademark), infrared communication, and the like can be used as the near-field communication. Hereinafter, in the present exemplary embodiment, it is assumed that Bluetooth (registered trademark) Low Energy (BLE) is used as the near-field communication.

The BLE is one of extended standards of Bluetooth (registered trademark), and is a low-power-consumption near-field communication standard using a 2.4 GHz band. Since the BLE has low power consumption to such an extent that the battery pack can be driven for several years with one button cell, it is suitable for battery driving, and the influence on the remaining capacity of battery pack 10 can be considered almost ignored. Since many modules for BLE communication are shipped to the market, the modules can be obtained at low cost. The BLE has high affinity with a smartphone, and can provide various services in cooperation with the smartphone.

When a general class II device is used, radio wave coverage of the BLE becomes about 10 m. Therefore, a state where there are the plurality of vehicles 30, the plurality of battery packs 10, and charging device 20 within a communication range of the BLE can occur. Since charging device 20 is provided with the plurality of charging slots, charging device 20 needs to wirelessly communicate with the plurality of battery packs 10 mounted into the plurality of charging slots. That is, a 1:N network is established between charging device 20 and the plurality of battery packs 10. Similarly, when vehicle 30 is provided with the plurality of mounting slots, vehicle 30 needs to wirelessly communicate with the plurality of battery packs 10 mounted into the plurality of mounting slots. That is, a 1:N network is established between vehicle 30 and the plurality of battery packs 10.

Therefore, a mechanism for ensuring that battery pack 10 mounted into a specific charging slot of charging device 20 and battery pack 10 of a specific communication partner of charging device 20 are identical is required. Similarly, a mechanism for ensuring that battery pack 10 mounted into a specific mounting slot of vehicle 30 and battery pack 10 of a specific communication partner of vehicle 30 are identical is required. In the present exemplary embodiment, the identity between battery pack 10 physically connected and battery pack 10 connected by wireless communication is confirmed by using identification information (ID). This identification information (ID) is sufficient to be temporal identification information. The identification information (ID) may include identification information unique to each device.

Figure 2:
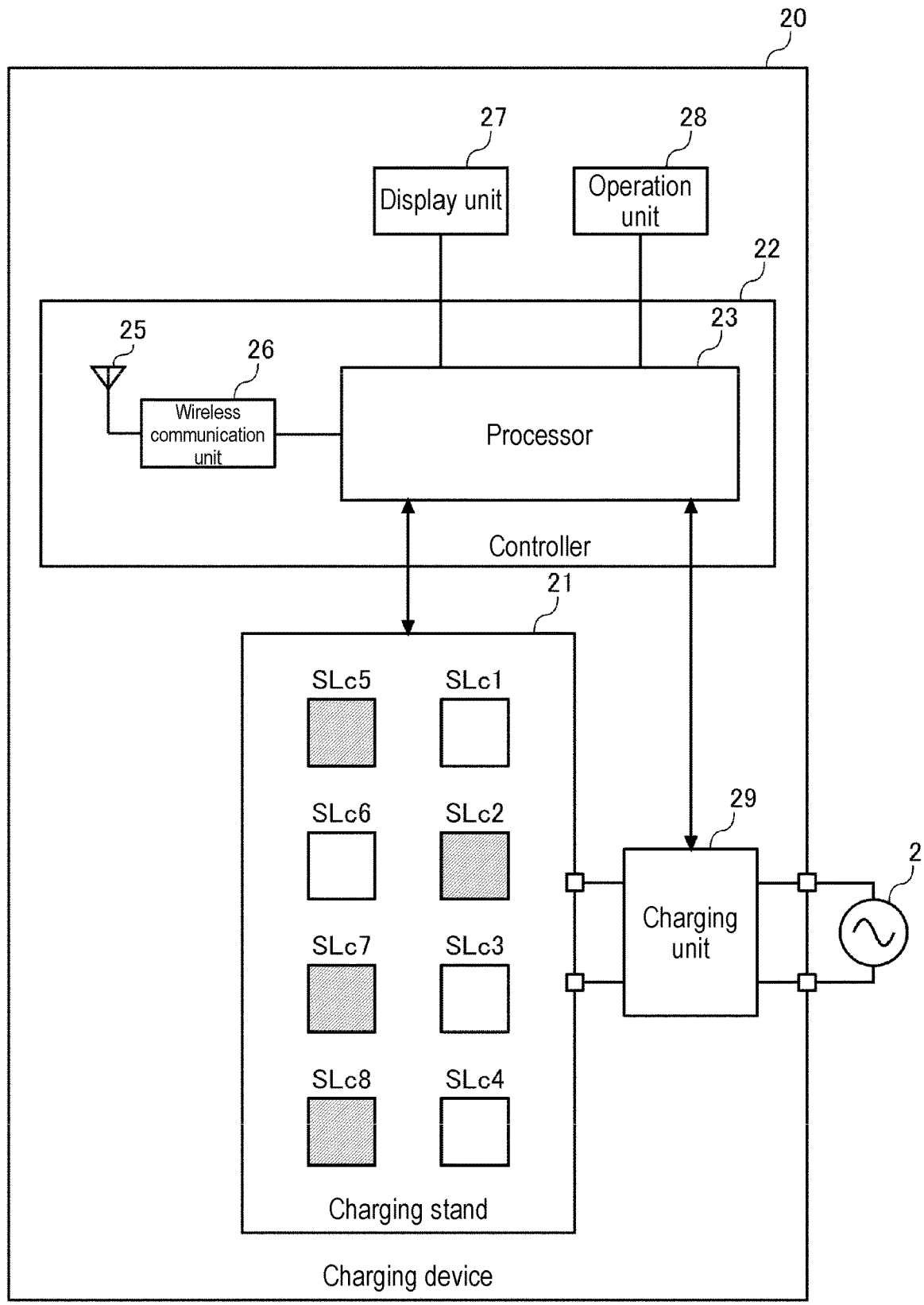
FIG. 2 is a view illustrating a configuration example of a charging device according to the exemplary embodiment.

FIG. 2 is a view illustrating a configuration example of charging device 20 according to the exemplary embodiment. Charging device 20 includes charging stand 21, controller 22, display unit 27, operation unit 28, and charging unit 29. Controller 22 at least includes processor 23, antenna 25, and wireless communication unit 26.

Charging stand 21 has a plurality of charging slots SLc1 to SLc8 for mounting the plurality of battery packs 10. Although the number of charging slots is eight in the example illustrated in FIG. 2, the number of charging slots may be two or more, and may be four, for example.

Each of charging slots SLc1 to SLc8 has a connector including a positive-electrode terminal and a negative-electrode terminal, and when battery pack 10 is mounted, the charging slots are conducted to the positive-electrode terminal and the negative-electrode terminal included in the connector of battery pack 10. A negative-electrode terminal part included in the connector of each of charging slots SLc1 to SLc8 and a negative-electrode terminal part included in the connector of battery pack 10 each may include solid GND. In this case, pins included in the connector of battery pack 10 can be integrated with one positive-electrode terminal pin, and the number of projection parts of the connector where defects are likely to occur can be reduced.

Processor 13 (see FIG. 4) of each battery pack 10 mounted into charging stand 21 transmits and receives a control signal to and from processor 23 in controller 22 by using the near-field communication and a power line. A specific transmission and reception method for the control signal between both will be described later.

The positive-electrode terminal and the negative-electrode terminal of each of charging slots SLc1 to SLc8 are connected to a positive-electrode terminal and a negative-electrode terminal of charging unit 29, respectively. Charging unit 29 is connected to commercial power system 2, and can charge battery pack 10 mounted into charging stand 21. Charging unit 29 generates DC power by performing full-wave rectifying of AC power supplied from commercial power system 2 and smoothing it by a filter.

A relay not illustrated is provided between the positive-electrode terminal and the negative-electrode terminal of charging unit 29 and between the positive-electrode terminal and the negative-electrode terminal of each of charging slots SLc1 to SLc8. Processor 23 controls conduction or interruption of each of charging slots SLc1 to SLc8 by performing control of on (close) or off (open) of the relay.

A DC/DC converter not illustrated may be provided between the positive-electrode terminal and the negative-electrode terminal of charging unit 29 and between the positive-electrode terminal and the negative-electrode terminal of each of charging slots SLc1 to SLc8. In this case, by controlling the DC/DC converter, processor 23 controls a charging voltage or a charging current of each battery pack 10. For example, constant current (CC) charging or constant voltage (CV) charging can be performed. The DC/DC converter may be provided in battery pack 10. When an AC/DC converter is equipped in battery pack 10, battery pack 10 can be charged with AC power from charging unit 29.

Processor 23 includes, for example, a microcomputer. Wireless communication unit 26 executes near-field communication processing. In the present exemplary embodiment, wireless communication unit 26 includes a BLE module, and antenna 25 includes a chip antenna or a pattern antenna built in the BLE module. Wireless communication unit 26 outputs, to processor 23, data received by the near-field communication, and broadcasts, by the near-field communication, data input from processor 23.

Processor 23 can acquire battery state information from battery pack 10 mounted into charging stand 21. As the battery state information, information on at least one of voltage, current, temperature, state of charge (SOC), and state of health (SOH) of a plurality of cells E1 to En (see FIG. 4) in battery pack 10 can be acquired.

Display unit 27 includes a display, and displays, on the display, guidance to the user (usually, the driver of vehicle 30) who uses charging device 20. Operation unit 28 is a user interface such as a touchscreen, and accepts an operation from the user. Charging device 20 may further include a speaker (not illustrated) to output audio guidance from the speaker to the user.

Figure 3:
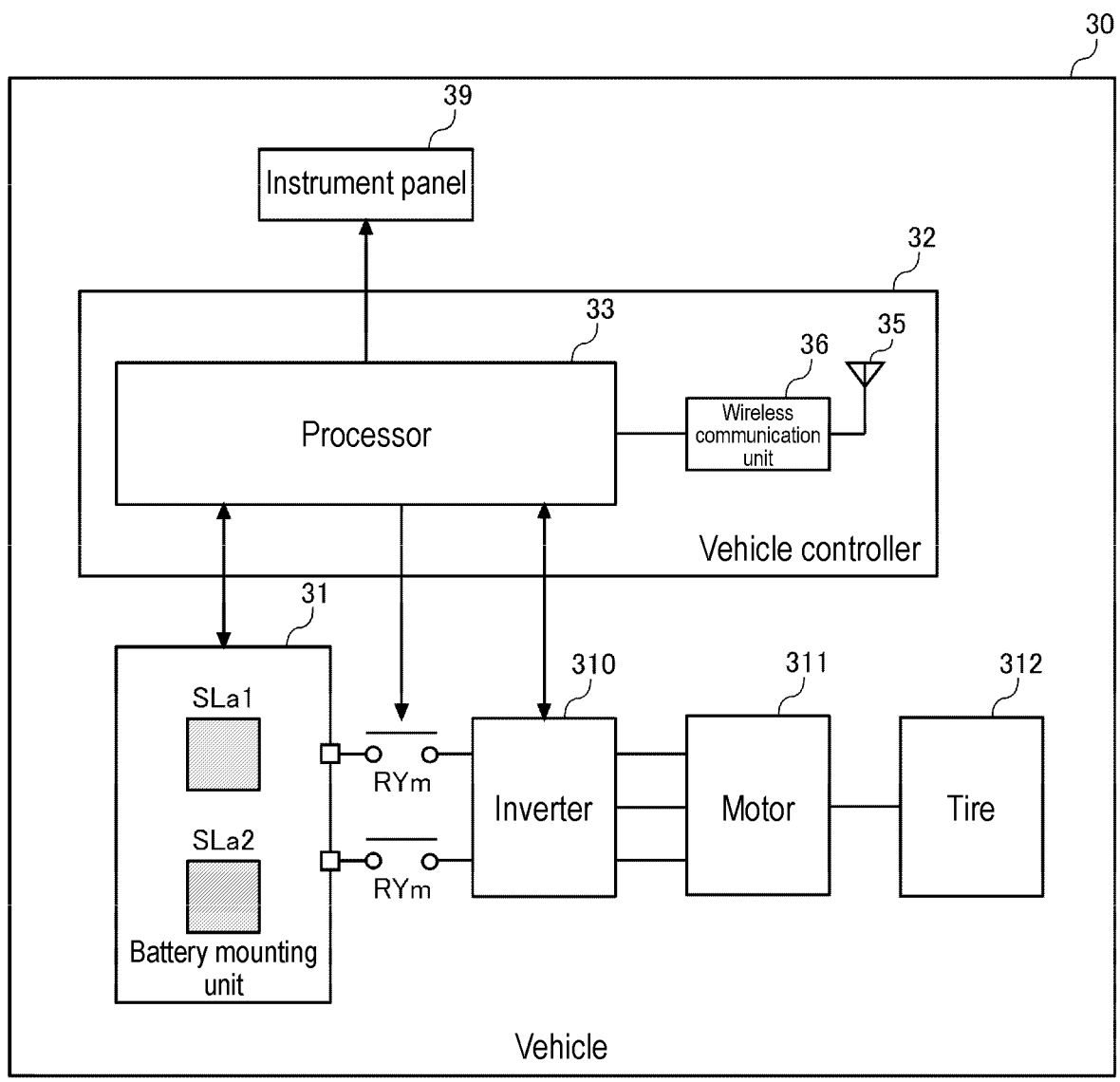
FIG. 3 is a view illustrating a configuration example of a vehicle according to the exemplary embodiment.

FIG. 3 is a view illustrating a configuration example of vehicle 30 according to the exemplary embodiment. Vehicle 30 includes battery mounting unit 31, vehicle controller 32, instrument panel 39, inverter 310, motor 311, and tire 312. Vehicle controller 32 at least includes processor 33, antenna 35, and wireless communication unit 36.

Battery mounting unit 31 has at least one of mounting slots SLa1 and SLa2 for mounting at least one battery pack 10. Although the number of mounting slots is two in the example illustrated in FIG. 3, the number of mounting slots may be one or three or more.

Each of mounting slots SLa1 and SLa2 has a connector including a positive-electrode terminal and a negative-electrode terminal, and when battery pack 10 is mounted, the mounting slots are conducted to the positive-electrode terminal and the negative-electrode terminal included in the connector of battery pack 10. A negative-electrode terminal part included in the connector of each of mounting slots SLa1 and SLa2 may include solid GND.

Processor 13 (see FIG. 4) of each battery pack 10 mounted into battery mounting unit 31 transmits and receives a control signal to and from processor 33 in vehicle controller 32 by using the near-field communication and a power line. A specific transmission and reception method for the control signal between both will be described later.

The plurality of positive-electrode terminals of the plurality of mounting slots SLa1 and SLa2 are each connected to a positive-side power bus, and the plurality of negative-electrode terminals are each connected to a negative-side power bus. Therefore, the plurality of battery packs 10 mounted into the plurality of mounting slots SLa1 and SLa2 have a relationship where they are electrically connected in parallel. Therefore, as the number of battery packs 10 mounted into battery mounting unit 31 increases, the capacity increases. The plurality of battery packs 10 mounted into the plurality of mounting slots SLa1 and SLa2 may be electrically connected in series. In that case, an output voltage can be increased.

A positive-electrode terminal and a negative-electrode terminal of battery mounting unit 31 are connected to a positive-electrode terminal and a negative-electrode terminal of inverter 310 via main relay RYm. Main relay RYm functions as a contactor between vehicle 30 and battery pack 10. Processor 33 controls conduction or interruption between vehicle 30 and battery pack 10 by performing control of on or off of main relay RYm.

Inverter 310 converts DC power supplied from battery pack 10 mounted into battery mounting unit 31 into AC power and supplies the AC power to motor 311 at the time of power running. The inverter converts AC power supplied from motor 311 into DC power and supplies the DC power to battery pack 10 mounted into battery mounting unit 31 at the time of regeneration. Motor 311 is a three-phase AC motor, and rotates in accordance with the AC power supplied from inverter 310 at the time of power running. The motor converts rotational energy by deceleration into AC power and supplies the AC power to inverter 310 at the time of regeneration. A rotary shaft of motor 311 is coupled to a rotary shaft of tire 312 of a rear wheel. A transmission may be provided between the rotary shaft of motor 311 and the rotary shaft of tire 312.

Vehicle controller 32 is a vehicle electronic control unit (ECU) that controls entire vehicle 30. Processor 33 of vehicle controller 32 includes a microcomputer. Wireless communication unit 36 executes near-field communication processing. In the present exemplary embodiment, wireless communication unit 36 includes a BLE module, and antenna 35 includes a chip antenna or a pattern antenna built in the BLE module. Wireless communication unit 36 outputs, to processor 33, data received by the near-field communication, and broadcasts, by the near-field communication, data input from processor 33.

Processor 33 can acquire battery state information from battery pack 10 mounted into battery mounting unit 31. As the battery state information, information on at least one of voltage, current, temperature, SOC, and SOH of the plurality of cells E1 to En (see FIG. 4) in battery pack 10 can be acquired. Processor 33 can acquire speed of vehicle 30.

Instrument panel 39 displays state information of vehicle 30. For example, the instrument panel displays the speed of vehicle 30 and the remaining capacity (SOC) of battery pack 10. The driver can judge the necessity of exchange of battery pack 10 by looking at the remaining capacity (SOC) of battery pack 10 displayed on instrument panel 39.

Figure 4:
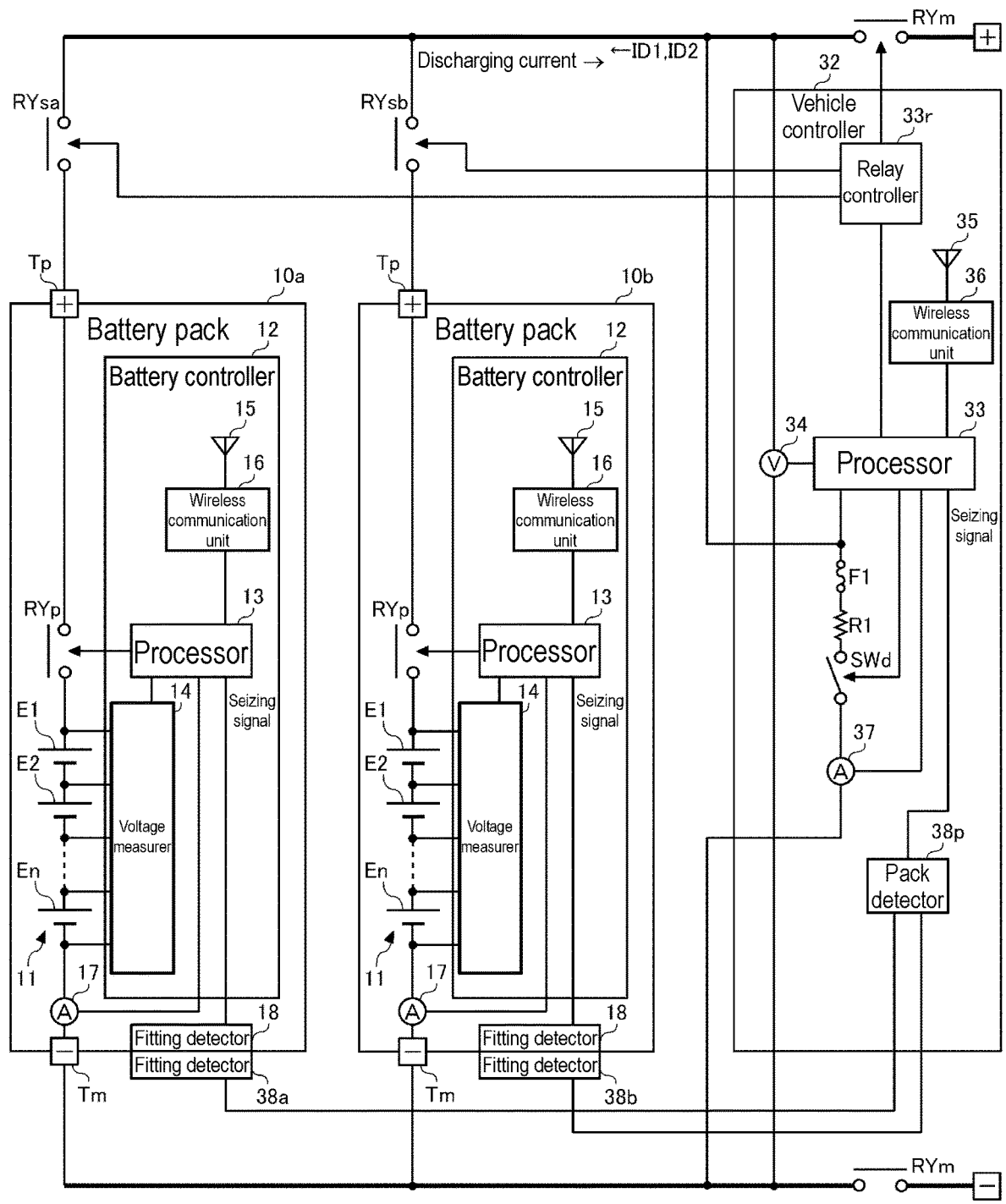
FIG. 4 is a view illustrating a system configuration example of a battery pack equipped in the vehicle and a vehicle controller according to the exemplary embodiment.

FIG. 4 is a view illustrating a system configuration example of battery pack 10 equipped in vehicle 30 and vehicle controller 32 according to the exemplary embodiment. The example illustrated in FIG. 4 presents a state where two battery packs 10a and 10b are mounted into battery mounting unit 31 of vehicle 30 (see FIG. 3).

Battery pack 10 includes battery module 11 and battery controller 12. Battery module 11 is connected on a power line internally connecting positive-electrode terminal Tp and negative-electrode terminal Tm of battery pack 10. Positive-electrode terminal Tp of battery pack 10 is connected to the positive-side power bus via slot relay RYs, and negative-electrode terminal Tm of battery pack 10 is connected to the negative-side power bus. The positive-side power bus and the negative-side power bus are connected to inverter 310 via main relay RYm (see FIG. 3).

Battery module 11 includes the plurality of cells E1 to En connected in series. Battery module 11 may be configured such that a plurality of battery modules are connected in series or in series-parallel. For the cell, a lithium ion battery cell, a nickel metal hydride battery cell, a lead battery cell, or the like can be used. Hereinafter, the present description assumes an example of use of a lithium ion battery cell (nominal voltage: 3.6 V to 3.7 V). The number of series connections of cells E1 to En is decided in accordance with a drive voltage of motor 311.

Current sensor 17 is installed on a power line internally connecting positive-electrode terminal Tp and negative-electrode terminal Tm of battery pack 10. Current sensor 17 is installed at a position closer to negative-electrode terminal Tm relative to power relay RYp. Current sensor 17 measures a current flowing through battery module 11, and outputs the measured current value to processor 13 of battery controller 12. Current sensor 17 can include, for example, a combination of a shunt resistor, a differential amplifier, and an A/D converter. A Hall element may be used in place of the shunt resistor.

Battery controller 12 includes processor 13, voltage measurer 14, antenna 15, and wireless communication unit 16. A plurality of voltage measurement lines connect between voltage measurer 14 and each node of the plurality of cells E1 to En connected in series. Voltage measurer 14 measures voltage of each of cells E1 to En by measuring each voltage between adjacent two voltage measurement lines. Voltage measurer 14 transmits the measured voltage value of each of cells E1 to En to processor 13.

Voltage measurer 14 is high in voltage with respect to processor 13, and therefore voltage measurer 14 and processor 13 are connected in an insulated state by a communication line. Voltage measurer 14 can be configured using an application specific integrated circuit (ASIC) or a general-purpose analog front-end IC. Voltage measurer 14 includes a multiplexer and an A/D converter. The multiplexer outputs a voltage between adjacent two voltage measurement lines to the A/D converter in order from the top. The A/D converter converts, into a digital value, an analog voltage to be input from the multiplexer.

Although not illustrated in FIG. 4, at least one temperature sensor is installed near the plurality of cells E1 to En. The temperature sensor measures the temperature of the plurality of cells E1 to En, and outputs the measured temperature value to processor 13. The temperature sensor can include, for example, a combination of a thermistor, a voltage dividing resistor, and an A/D converter.

In a case where an A/D converter is equipped in processor 13 and an analog input port is installed in processor 13, output values of current sensor 17 and the temperature sensor can be input to processor 13 as analog values.

Fitting detector 18 detects a fitting state between the connector of battery pack 10 and the connector of battery mounting unit 31 of vehicle 30. For example, the connector on battery pack 10 may be a female connector, and the connector on battery mounting unit 31 of vehicle 30 may be a male connector. Fitting detector 18 outputs seizing signals corresponding to connection states of both to processor 13. The seizing signal is defined by a binary signal, and an on signal is output in a state where both are connected, and an off signal is output in a state where both are separated. Fitting detector 18 can include, for example, a reed switch. In this case, fitting detector 18 magnetically determines presence or absence of connection between both. A sensor that mechanically detects the presence or absence of connection between both may be used.

Wireless communication unit 16 executes near-field communication processing. In the present exemplary embodiment, wireless communication unit 16 includes a BLE module, and antenna 15 includes a chip antenna or a pattern antenna built in the BLE module. Wireless communication unit 16 outputs, to processor 13, data received by the near-field communication, and broadcasts, by the near-field communication, data input from processor 13.

Processor 13 includes a microcomputer. Processor 13 is activated when the seizing signal input from fitting detector 18 is turned on, and is shut down when the seizing signal is turned off. Instead of shutdown, transition to a standby state or a sleep state may be performed.

Processor 13 manages states of the plurality of cells E1 to En based on the voltage values, the current values, and the temperature values of the plurality of cells E1 to En measured by voltage measurer 14, current sensor 17, and the temperature sensor. For example, when overvoltage, undervoltage, overcurrent, high-temperature abnormality, or low-temperature abnormality occurs, processor 13 turns off power relay RYp to protect the plurality of cells E1 to En.

Processor 13 can estimate the SOC and the SOH of each of the plurality of cells E1 to En. Processor 13 can estimate the SOC by using an open circuit voltage (OCV) method or a current integration method. The SOH is defined as a ratio of current full charge capacity to initial full charge capacity, and a lower value (closer to 0%) indicates that degradation has progressed more. The SOH may be obtained by measuring the capacity through full charging and discharging, or may be obtained by adding storage degradation and cycle degradation. The storage degradation can be estimated based on the SOC, the temperature, and a storage degradation speed. The cycle degradation can be estimated based on the SOC range to be used, the temperature, the current rate, and the cycle degradation speed. The storage degradation speed and the cycle degradation speed can be derived preliminarily by an experiment or simulation. The SOC, the temperature, the SOC range, and the current rate can be obtained by measurement.

The SOH can also be estimated based on a correlation with an internal resistance of the cell. The internal resistance can be estimated by dividing, by the current value, a voltage drop occurring when a predetermined current flows through the cell for a predetermined time. The internal resistance has a relationship of decreasing as the temperature rises, and increasing as the SOH decreases.

In the system configuration example illustrated in FIG. 4, vehicle controller 32 includes processor 33, relay controller 33r, voltage sensor 34, current sensor 37, antenna 35, wireless communication unit 36, and pack detector 38p. Relay controller 33r performs control of on and off of each of main relay RYm, first slot relay RYsa, and second slot relay RYsb in response to an instruction from processor 33.

First fitting detector 38a detects a fitting state between the connector of first mounting slot SLa1 of battery mounting unit 31 and the connector of first battery pack 10a, and outputs, to pack detector 38p, a detection signal indicating presence or absence of fitting. Similarly, second fitting detector 38b detects a fitting state between the connector of second mounting slot SLa2 of battery mounting unit 31 and the connector of second battery pack 10b, and outputs, to pack detector 38p, a detection signal indicating presence or absence of fitting. First fitting detector 38a and second fitting detector 38*b* may detect presence or absence of connection with the connector on battery pack 10 by a magnetic method or a mechanical method.

Pack detector 38*p* outputs, to processor 33, seizing signals corresponding to a plurality of detection signals input from the plurality of fitting detectors 38*a* and 38*b*. In a case where at least one of the plurality of detection signals indicates a connection state, pack detector 38*p* outputs a seizing signal including a slot number of the connection state. In a case where all of the plurality of detection signals indicate a non-connection state, pack detector 38*p* controls the seizing signal to be in an off state.

Processor 33 is activated when the seizing signal input from pack detector 38*p* is turned on, and is shut down when the seizing signal is turned off. Instead of shutdown, transition to a standby state or a sleep state may be performed.

A discharging path is provided between the positive-side power bus and the negative-side power bus. Fuse F1, resistor R1, and discharging switch SWd are connected in series on the discharging path. Voltage sensor 34 for measuring the voltage between the positive-side power bus and the negative-side power bus is installed. Voltage sensor 34 outputs the measured voltage value to processor 33 of vehicle controller 32. Current sensor 37 is installed on the discharging path. Current sensor 37 measures the current flowing through the discharging path, and outputs the measured current value to processor 33 of vehicle controller 32. Processor 33 can conduct between the positive-side power bus and the negative-side power bus by turning on discharging switch SWd.

Processor 33 of vehicle controller 32 can transmit and receive control signals to and from processor 13 of battery controller 12 by using near-field communication.

Processor 33 of vehicle controller 32 can transfer control information to processor 13 of battery controller 12 via a wired path. When transferring control information to processor 13 of first battery pack 10*a* via wire, processor 33 of vehicle controller 32 turns on first slot relay RYsa and turns off second slot relay RYsb. In this state, processor 33 performs on or off control of discharging switch SWd according to a pulse pattern indicating the control information. Due to this, a discharging current including the pulse pattern flows from a positive electrode of first battery pack 10*a* to a negative electrode of first battery pack 10*a* via the discharging path. Current sensor 17 of first battery pack 10*a* detects a current including the pulse pattern and outputs the current to processor 13. Processor 13 receives the control information corresponding to the pulse pattern based on a current value including the pulse pattern input from current sensor 17.

Similarly, when transferring control information to processor 13 of second battery pack 10*b* via wire, processor 33 of vehicle controller 32 turns on second slot relay RYsb and turns off first slot relay RYsa. In this state, processor 33 performs on or off control of discharging switch SWd according to a pulse pattern indicating the control information. Due to this, a discharging current including the pulse pattern flows from a positive electrode of second battery pack 10*b* to a negative electrode of second battery pack 10*b* via the discharging path. Current sensor 17 of second battery pack 10*b* detects a current including the pulse pattern and outputs the current to processor 13. Processor 13 receives the control information corresponding to the pulse pattern based on a current value including the pulse pattern input from current sensor 17.

Processor 33 of vehicle controller 32 can receive the voltage of the power line on battery pack 10 side (voltage between both ends of battery module 11) from processor 13 of battery controller 12 by using near-field communication. Processor 33 of vehicle controller 32 can measure the contact resistance between battery pack 10 and vehicle 30 based on the voltage on battery pack 10 side having been received, the voltage of the power line on vehicle 30 side measured by voltage sensor 34, and the current measured by current sensor 37.

Specifically, by calculating differential voltage ΔV between voltage VB on battery pack 10 side having been received and voltage VA of the power line on vehicle 30 side measured by voltage sensor 34, and dividing calculated differential voltage ΔV by current I, processor 33 of vehicle controller 32 can calculate contact resistance R between the two as presented in the following (Formula 1).

$$R=(VB-VA)/I \qquad \text{(Formula 1)}$$

For current I, not the current measured by current sensor 37 of vehicle controller 32 but the current measured by current sensor 17 of battery controller 12 may be used by receiving from processor 13 of battery controller 12.

Processor 13 of battery controller 12 can receive the voltage of the power line on vehicle 30 side from processor 33 of vehicle controller 32 by using near-field communication. Processor 13 of battery controller 12 can measure the contact resistance between battery pack 10 and vehicle 30 based on the received voltage on vehicle 30 side, the voltage of the power line on battery pack 10 side measured by voltage measurer 14, and the current measured by current sensor 17.

Specifically, by calculating differential voltage ΔV between voltage VB of the power line on battery pack 10 side measured by voltage measurer 14 and voltage VA on vehicle 30 side having been received, and dividing calculated differential voltage ΔV by current I, processor 13 of battery controller 12 can calculate contact resistance R between the two as presented in the above (Formula 1). For current I, not the current measured by current sensor 17 of battery controller 12 but the current measured by current sensor 37 of vehicle controller 32 may be used by receiving from processor 33 of vehicle controller 32.

In the system configuration example illustrated in FIG. 4, at least one of main relay RYm, slot relay RYs, and power relay RYp may be replaced with a semiconductor switch. Discharging switch SWd may be replaced with a relay.

Although not illustrated in FIG. 2, a similar configuration to that of vehicle controller 32 illustrated in FIG. 4 is also provided in controller 22 of charging device 20. In the case of vehicle 30, the connection destination of the power bus is inverter 310, but in the case of charging device 20, the connection destination of the power bus is charging unit 29. In charging device 20, the number of slots connected to the power bus is usually larger than that of vehicle 30.

Processor 23 of charging device 20 can transmit and receive control signals to and from processor 13 of battery controller 12 with the near-field communication between wireless communication unit 26 of charging device 20 and wireless communication unit 16 of battery controller 12. Processor 23 of charging device 20 can transmit a control signal to processor 13 of battery controller 12 via a wired path.

Figure 5:
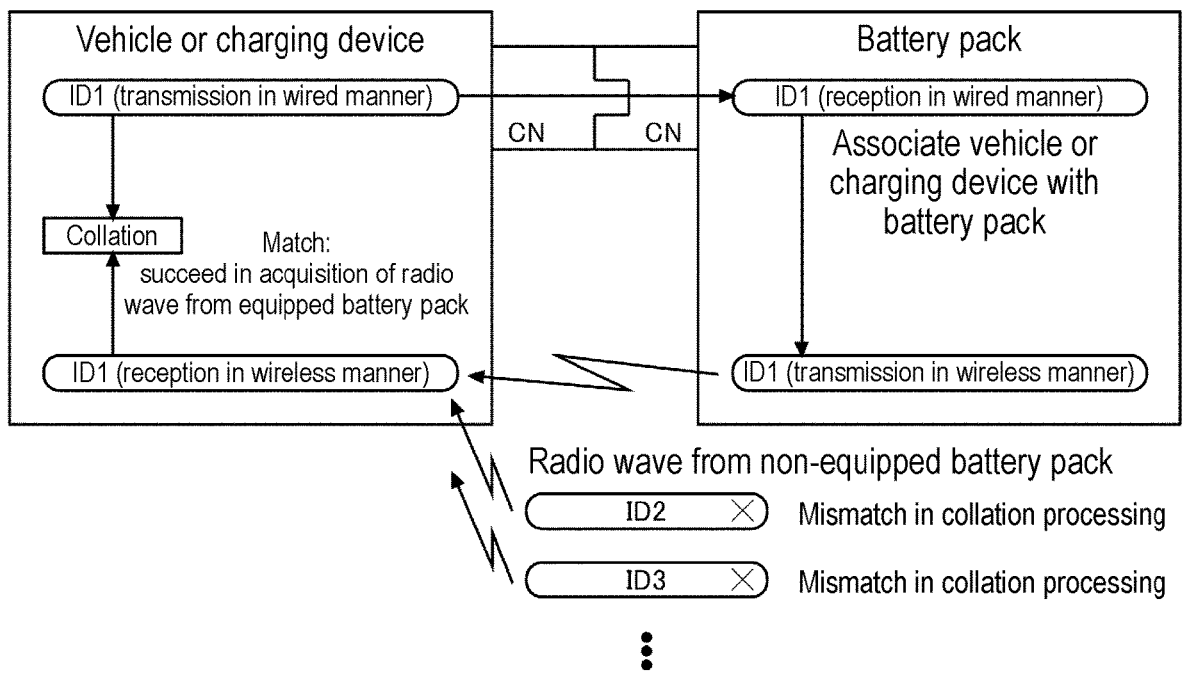
FIG. 5 is a view illustrating a basic concept of processing of authenticating, by a vehicle controller, a battery pack mounted into a mounting slot of the vehicle.

FIG. 5 is a view illustrating a basic concept of processing of authenticating, by vehicle controller 32, battery pack 10 mounted into mounting slot SLa of vehicle 30. Vehicle controller 32 identifies battery pack 10 basically by searching for a radio wave of near-field communication broadcasted from battery pack 10. Specifically, when battery pack 10 is mounted into mounting slot SLa, vehicle controller 32 transmits ID1 via wire. Upon receiving ID1 from vehicle controller 32 via wire, battery controller 12 of battery pack 10 broadcasts a signal including ID1 by near-field communication.

Upon receiving the signal of the near-field communication, vehicle controller 32 collates ID included in the received signal with ID previously transmitted via wire. When both match, vehicle controller 32 authenticates that battery pack 10 mounted into mounting slot SLa and the communication partner of the near-field communication are identical. When both do not match, vehicle controller 32 determines that battery pack 10 mounted into mounting slot SLa and the communication partner of the near-field communication are not identical, and does not authenticate battery pack 10 of the communication partner. For example, when a signal including ID2 is received, since ID does not match ID transmitted via wire, battery pack 10 of the transmission destination of the signal including ID2 is not authenticated.

By broadcasting ID by the near-field communication, and collate the broadcasted ID with ID received from battery controller 12 of battery pack 10 via wire, vehicle controller 32 may judge the identity between battery pack 10 mounted into mounting slot SLa and the communication partner of the near-field communication.

Although the basic concept of the processing of authenticating, by vehicle controller 32, battery pack 10 mounted into mounting slot SLa of vehicle 30 has been described above, the same applies to a case where controller 22 of a charging device 20 authenticates battery pack 10 mounted into charging slot SLc of charging device 20.

Figure 6:
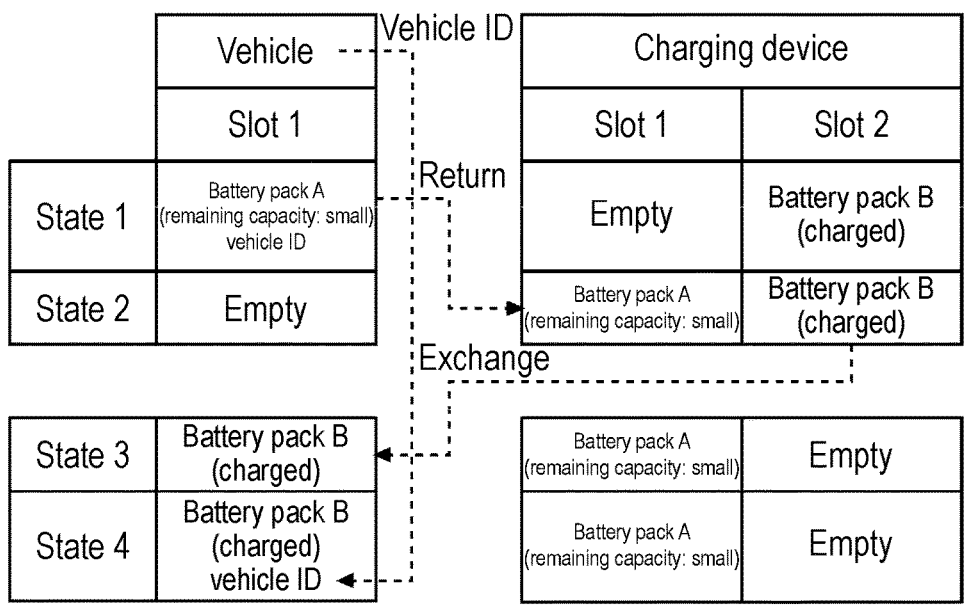
FIG. 6 is a view schematically illustrating a flow of granting ID to an exchanged battery pack when the battery pack mounted into the mounting slot of the vehicle is exchanged.

FIG. 6 is a view schematically illustrating the flow of granting ID to exchanged battery pack 10 when battery pack 10 mounted into mounting slot SLa of vehicle 30 is exchanged. In state 1, first charging slot SLc1 of charging device 20 is an empty slot, and charged second battery pack 10b is mounted into second charging slot SLc2. First battery pack 10a having a reduced remaining capacity is mounted into first mounting slot SLa1 of vehicle 30. First battery pack 10a includes a vehicle ID authenticated by vehicle controller 32. The vehicle ID ensures the identity between first battery pack 10a as a physical connection partner and first battery pack 10a as a connection partner of wireless communication as viewed from vehicle 30 side.

In state 2, the user (usually, the driver of vehicle 30) unmounts first battery pack 10a from first mounting slot SLa1 of vehicle 30, and mounts unmounted first battery pack 10a into first charging slot SLc1 of charging device 20. When first battery pack 10a is rented, a work of returning first battery pack 10a to charging device 20 is performed. When first battery pack 10a is unmounted from first mounting slot SLa1 of vehicle 30, battery controller 12 of first battery pack 10a deletes the retained vehicle ID.

In state 3, second battery pack 10b is unmounted from second charging slot SLc2 of charging device 20, and is mounted into first mounting slot SLa1 of vehicle 30 by the user. By this work, battery pack 10 mounted into first mounting slot SLa1 of vehicle 30 is physically exchanged.

In state 4, vehicle controller 32 grants a new vehicle ID to second battery pack 10b mounted into first mounting slot SLa1. This new vehicle ID ensures the identity between second battery pack 10b as a physical connection partner and second battery pack 10b as a connection partner of wireless communication as viewed from vehicle 30 side.

Figure 7:
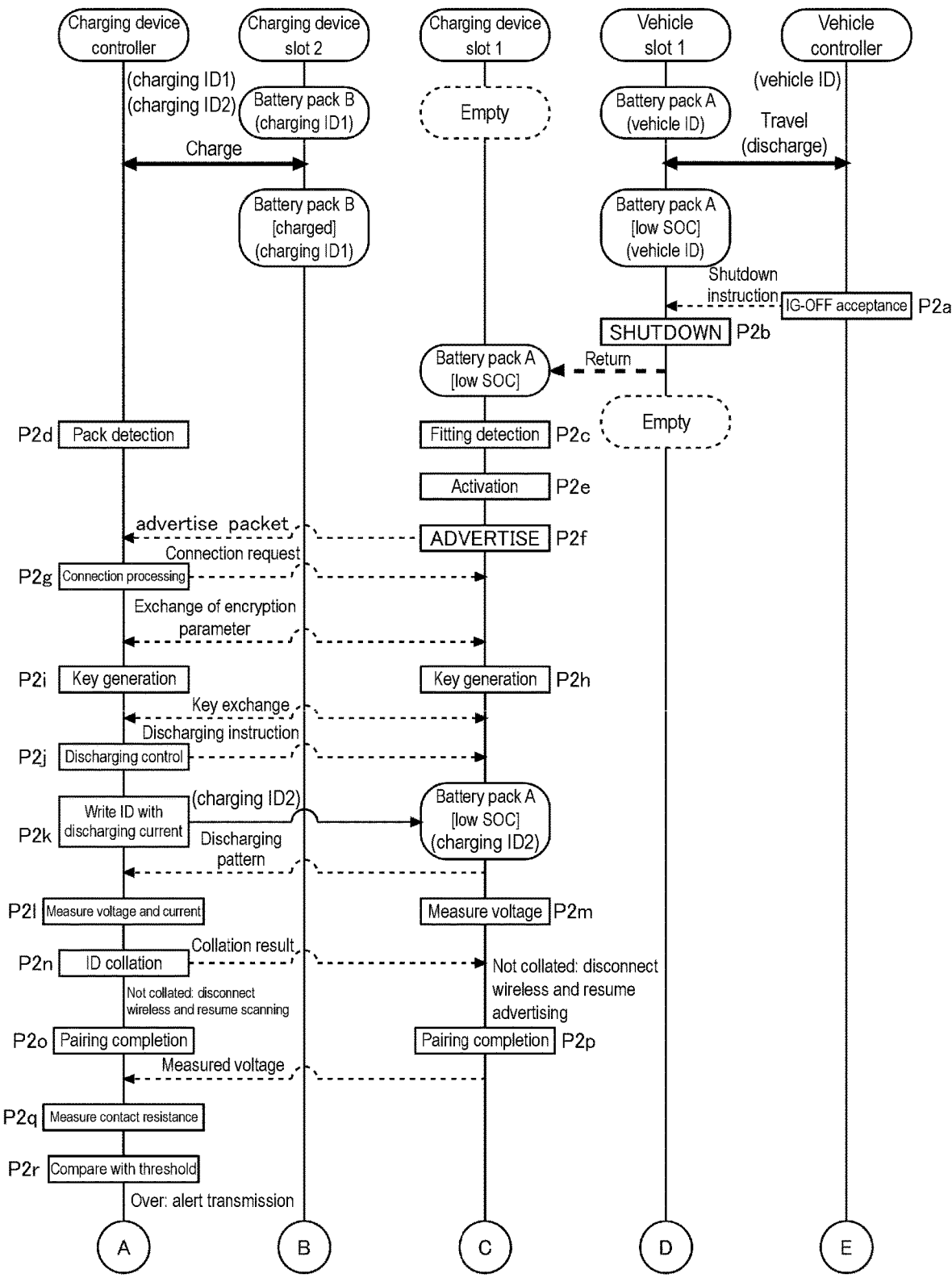
FIG. 7 is a sequence diagram illustrating a detailed processing flow when a battery pack mounted into the mounting slot of the vehicle is exchanged (part 1).
Figure 8:
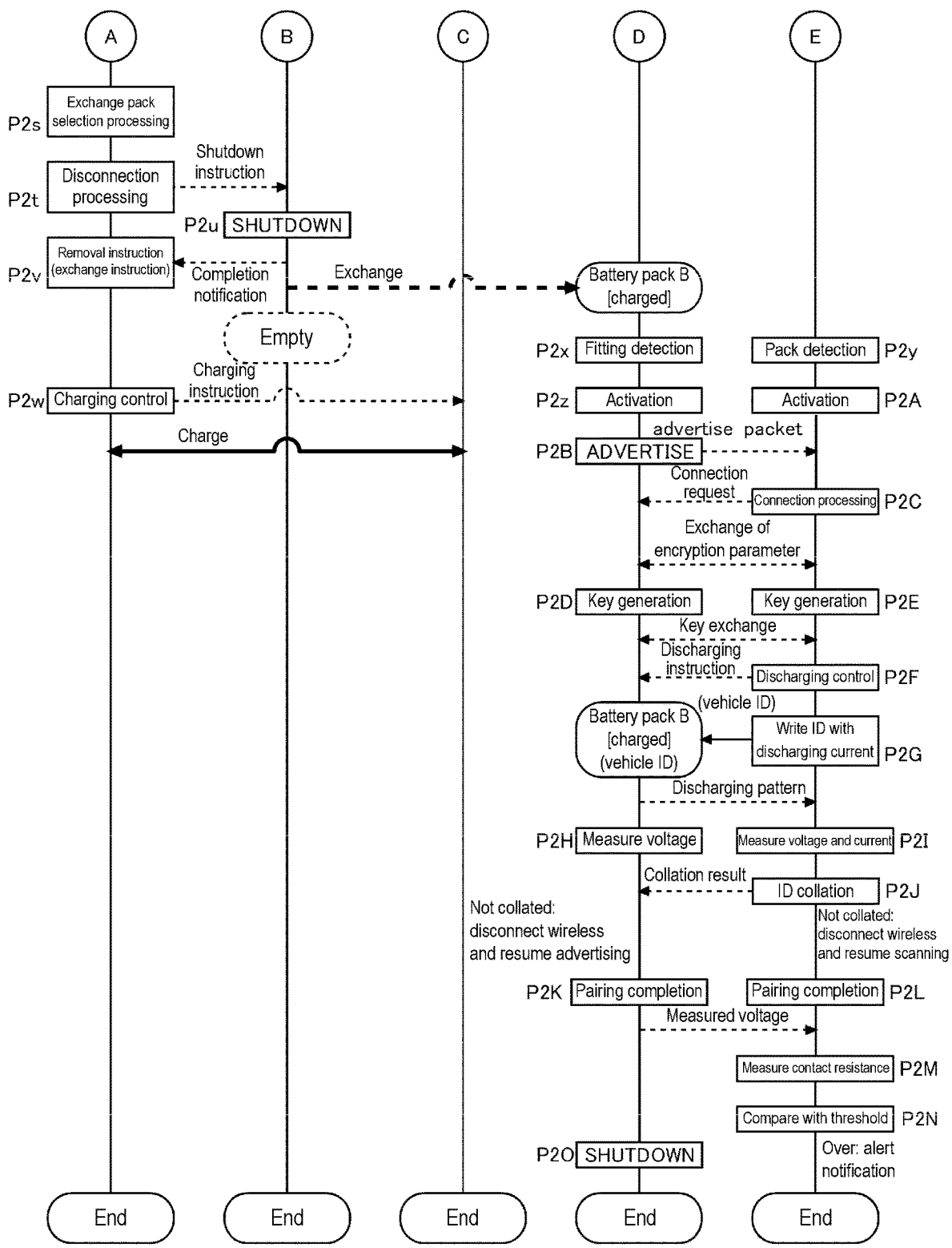
FIG. 8 is a sequence diagram illustrating a detailed processing flow when a battery pack mounted into the mounting slot of the vehicle is exchanged (part 2).

FIG. 7 is a sequence diagram illustrating a detailed processing flow when battery pack 10 mounted into mounting slot SLa of vehicle 30 is exchanged (part 1). FIG. 8 is a sequence diagram illustrating a detailed processing flow when battery pack 10 mounted into mounting slot SLa of vehicle 30 is exchanged (part 2). In horizontal lines in the following sequence diagrams, a thin dotted line indicates wireless communication, a thin solid line indicates wired communication, a thick dotted line indicates physical movement of the battery pack, and a thick solid line indicates charge and discharge of the battery pack.

First charging slot SLc1 of charging device 20 is an empty slot, and second battery pack 10b is mounted into second charging slot SLc2. Second battery pack 10b includes charging ID1 authenticated by controller 22 of charging device 20. Charging ID1 ensures the identity between second battery pack 10b as a physical connection partner and second battery pack 10b as a connection partner of wireless communication as viewed from charging device 20 side.

Charging device 20 charges second battery pack 10b mounted into second charging slot SLc2. That is, a charging current flows from charging unit 29 to second battery pack 10b mounted into second charging slot SLc2. When the SOC of second battery pack 10b reaches an upper limit value, charging ends. The upper limit value may be an SOC corresponding to a full charge capacity or an SOC (for example, 90%) lower than the full charge capacity.

First battery pack 10a is mounted into first mounting slot SLa1 of vehicle 30. First battery pack 10a includes a vehicle ID authenticated by vehicle controller 32. The vehicle ID ensures the identity between first battery pack 10a as a physical connection partner and first battery pack 10a as a connection partner of wireless communication as viewed from vehicle 30 side. While vehicle 30 is travelling, a discharging current flows from first battery pack 10a to motor 311 via inverter 310. The SOC of first battery pack 10a decreases with travel of vehicle 30.

When an ignition-off operation is performed by the user (usually, the driver of vehicle 30), vehicle controller 32 accepts the ignition-off operation (P2a). Upon accepting the ignition-off operation, vehicle controller 32 broadcasts a shutdown instruction to battery controller 12 of first battery pack 10a by the near-field communication. Upon receiving the shutdown instruction from vehicle controller 32, battery controller 12 of first battery pack 10a is shut down (P2b).

When first battery pack 10a is unmounted from first mounting slot SLa1 of vehicle 30 and first battery pack 10a is mounted into first charging slot SLc1 of charging device 20 by the user, fitting detector 18 of first battery pack 10a detects fitting with first charging slot SLc1 (P2c), and battery controller 12 of first battery pack 10a is activated (P2e). Controller 22 of charging device 20 detects that battery pack 10 is mounted into first charging slot SLc1 (P2d). Battery controller 12 of first battery pack 10a deletes the vehicle ID when recognizing to be unmounted from first mounting slot SLa1.

Battery controller 12 of first battery pack 10a serves as a beacon terminal and executes advertising of the near-field communication (P2f). In the example illustrated in FIG. 7, the charging ID or the vehicle ID is not included in the advertising packet.

Upon receiving the advertising packet, controller 22 of charging device 20 starts connection processing with battery controller 12 of first battery pack 10a (P2g). First, controller 22 of charging device 20 transmits a connection request to battery controller 12 of first battery pack 10a. Next, encryption parameters are exchanged between controller 22 of charging device 20 and battery controller 12 of first battery pack 10a. Battery controller 12 of first battery pack 10a generates an encryption key for use in encryption of communication data based on the exchanged encryption parameters (P2h). Controller 22 of charging device 20 generates an encryption key for use in encryption of communication data based on the exchanged encryption parameters (P2i). Finally, the generated encryption key is exchanged between controller 22 of charging device 20 and battery controller 12 of first battery pack 10a. Due to this, controller 22 of charging device 20 and battery controller 12 of first battery pack 10a are temporarily connected.

Controller 22 of charging device 20 starts discharging control of first battery pack 10a (P2j). Specifically, controller 22 of charging device 20 broadcasts a discharging instruction to battery controller 12 of first battery pack 10a by near-field communication, and turns on discharging switch SWd of charging device 20 and first slot relay RYsa. Upon receiving the discharging instruction, battery controller 12 of first battery pack 10a turns on power relay RYp. Due to this, a discharging path is formed between both ends of first battery pack 10a, and a discharging current flows through first battery pack 10a.

Controller 22 of charging device 20 controls on or off of discharging switch SWd according to a discharging pattern corresponding to charging ID2. Battery controller 12 of first battery pack 10a reads the discharging pattern from the current value detected by current sensor 17 and acquires charging ID2. A communication pulse generated by such control of the discharging current is communicated between controller 22 of charging device 20 and battery controller 12 of first battery pack 10a, and charging ID2 is written from controller 22 of charging device 20 to battery controller 12 of first battery pack 10a (P2k). Battery controller 12 of first battery pack 10a broadcasts the discharging pattern corresponding to read charging ID2 to controller 22 of charging device 20 by the near-field communication.

During the period where the discharging current including the discharging pattern according to charging ID2 flows, controller 22 of charging device 20 measures the voltage of the power line on charging device 20 side by the voltage sensor of charging device 20, and measures the current flowing through the discharging path by the current sensor of charging device 20 (P2l). During the period where the discharging current including the discharging pattern according to charging ID2 flows, battery controller 12 of first battery pack 10a measures the voltage of the power line on first battery pack 10a side by voltage measurer 14 (P2m).

Upon receiving a signal including a discharging pattern from battery controller 12 of first battery pack 10a, controller 22 of charging device 20 collates the charging ID indicated by the received discharging pattern with the charging ID previously transferred via wire (P2m). In the example illustrated in FIG. 7, the collation succeeds if the charging ID indicated by the discharging pattern included in the received signal is charging ID2, and the collation fails if the charging ID is not charging ID2.

Controller 22 of charging device 20 broadcasts the collation result to battery controller 12 of first battery pack 10a by the near-field communication. When the collation fails, controller 22 of charging device 20 disconnects the temporary connection with battery controller 12 of first battery pack 10a, and resumes scanning of the advertising packet after a predetermined time elapses. Battery controller 12 of first battery pack 10a disconnects the temporary connection with controller 22 of charging device 20, and resumes the advertising of the near-field communication. In the case of successful collation, pairing between controller 22 of charging device 20 and battery controller 12 of first battery pack 10a is completed (P2o and P2p). With the completion of the pairing of both, returning processing of first battery pack 10a to charging device 20 is completed.

When the pairing is completed, battery controller 12 of first battery pack 10a broadcasts the voltage of the power line on first battery pack 10a side having been measured to controller 22 of charging device 20 by the near-field communication. Controller 22 of charging device 20 measures the contact resistance between charging device 20 and first battery pack 10a based on the voltage of the power line on first battery pack 10a side having been received, the voltage of the power line on charging device 20 side having been measured, and the current of the discharging path having been measured (P2q). At that time, controller 22 of charging device 20 desirably adopts, as a formal value of the contact resistance, a value in a state where the value of the contact resistance having been measured has converged. Since the discharging current from first battery pack 10a is a communication pulse that forms a discharging pattern according to the identification information such as charging ID1 and ID2, the communication pulse does not fully rise if the pulse width is short, and the contact resistance is measured based on a value in the middle of the rise of the pulse current, and the measured contact resistance is low in reliability. On the other hand, for example, controller 22 of charging device 20 measures the contact resistance from a resistance measurement communication pulse using a communication pulse signal where the resistance measurement communication pulse having a width longer than the width of an identification information communication pulse is granted to the identification information communication pulse forming a current pattern according to the identification information. The width of the identification information communication pulse is set to, for example, 1 μsecond to 0.1 m second, and in this case, the width of the resistance measurement communication pulse is set to, for example, 1 μsecond to a value longer than 0.1 m second and shorter than 10 m second. This makes it possible to reliably measure the contact resistance in an appropriate measurement period while minimizing the extension of the period where the discharging current including the discharging pattern according to the identification information flows. Controller 22 of charging device 20 may continue the measurement of the contact resistance until the value of the contact resistance having been measured becomes stable, or may measure the contact resistance by the contact resistance value in a converged state estimated based on the current change from the start of discharge. Due to these, a highly reliable contact resistance can be measured.

Controller 22 of charging device 20 compares the measured contact resistance with a threshold set in advance by a designer (P2r). When the measured contact resistance exceeds the threshold, controller 22 of charging device 20 controls discharging switch SWd and first slot relay RYsa to be turned off. Controller 22 of charging device 20 transmits an alert signal to a terminal device (not illustrated) of a manager of charging device 20. Upon receiving the alert signal to the terminal device, the manager of charging device 20 goes to the installation place of charging device 20. The manager checks the terminal part of first charging slot SLc1 and the terminal part of first battery pack 10a with an inspection device (not illustrated) to specify the cause of the increase in the contact resistance.

If the cause is present in the terminal part of first charging slot SLc1, the terminal part of first charging slot SLc1 is maintained, repaired, or exchanged, or entire first charging slot SLc1 is exchanged. Alternatively, first charging slot SLc1 is disabled. If the cause is present in the terminal part of first battery pack 10*a*, the terminal part of first battery pack 10*a* is maintained, repaired, or exchanged, or first battery pack 10*a* is discarded. In a case of temporary contact failure, the contact failure is sometimes eliminated by removing first battery pack 10*a* once and mounting it once again. If the measured contact resistance does not exceed the threshold, no alert signal is transmitted to the manager's terminal device.

Controller 22 of charging device 20 selects another battery pack 10 to be exchanged with first battery pack 10*a* (P2*s*). Specifically, controller 22 of charging device 20 selects one of charged battery packs 10 mounted into the plurality of charging slots SLc of charging stand 21. In the example illustrated in FIG. 8, charged second battery pack 10*b* mounted into second charging slot SLc2 is selected.

Controller 22 of charging device 20 broadcasts a shutdown instruction to battery controller 12 of selected second battery pack 10*b* by the near-field communication, and executes disconnection processing with battery controller 12 of second battery pack 10*b* (P2*t*). Upon receiving the shutdown instruction from controller 22 of charging device 20, battery controller 12 of second battery pack 10*b* is shut down (P2*u*). Battery controller 12 of second battery pack 10*b* transmits a shutdown completion notification to controller 22 of charging device 20 immediately before the shutdown.

Upon receiving the shutdown completion notification from battery controller 12 of second battery pack 10*b*, controller 22 of charging device 20 instructs the user of vehicle 30 to remove second battery pack 10*b* mounted into second charging slot SLc2 (P2*v*). For example, controller 22 of charging device 20 causes display unit 27 to display a message instructing to remove second battery pack 10*b* mounted into second charging slot SLc2. At this time, controller 22 of charging device 20 may output audio guidance from the speaker (not illustrated) to the user. Controller 22 may light or blink only a lamp (not illustrated) of second charging slot SLc2. Controller 22 may light only the lamp (not illustrated) of second charging slot SLc2 in a color different from color of a lamp of another charging slot.

When the user removes second battery pack 10*b* from second charging slot SLc2 and mounts second battery pack 10*b* into first mounting slot SLa1 of vehicle 30, fitting detector 18 of second battery pack 10*b* detects fitting with first mounting slot SLa1 (P2*x*), and battery controller 12 of second battery pack 10*b* is activated (P2*z*). When fitting detector 38 of vehicle 30 detects that battery pack 10 is mounted into first mounting slot SLa1 (P2*y*), vehicle controller 32 is activated (P2A). Battery controller 12 of second battery pack 10*b* deletes charging ID2 when recognizing to be unmounted from second charging slot SLc2.

Controller 22 of charging device 20 starts charging control of first battery pack 10*a* mounted into first charging slot SLc1 (P2*w*). Specifically, controller 22 of charging device 20 broadcasts a charging instruction to battery controller 12 of first battery pack 10*a* by the near-field communication, and turns on second slot relay RYsb. Upon receiving the charging instruction, battery controller 12 of first battery pack 10*a* turns on power relay RYp. Due to this, a charging current flows from charging unit 29 of charging device 20 to first battery pack 10*a* mounted into first charging slot SLc1.

Battery controller 12 of second battery pack 10*b* serves as a beacon terminal and executes advertising of the near-field communication (P2B). In the example illustrated in FIG. 8, the charging ID or the vehicle ID is not included in the advertising packet.

Upon receiving the advertising packet, vehicle controller 32 starts connection processing with battery controller 12 of second battery pack 10*b* (P2C). First, vehicle controller 32 transmits a connection request to battery controller 12 of second battery pack 10*b*. Next, encryption parameters are exchanged between vehicle controller 32 and battery controller 12 of second battery pack 10*b*. Battery controller 12 of second battery pack 10*b* generates an encryption key for use in encryption of communication data based on the exchanged encryption parameters (P2D). Vehicle controller 32 generates an encryption key for use in encryption of communication data based on the exchanged encryption parameters (P2E). Finally, the generated encryption key is exchanged between vehicle controller 32 and battery controller 12 of second battery pack 10*b*. Due to this, vehicle controller 32 and battery controller 12 of second battery pack 10*b* are temporarily connected.

Vehicle controller 32 starts discharging control of second battery pack 10*b* (P2F). Specifically, vehicle controller 32 broadcasts a discharging instruction to battery controller 12 of second battery pack 10*b* by near-field communication, and turns on discharging switch SWd and second slot relay RYsb. Upon receiving the discharging instruction, battery controller 12 of second battery pack 10*b* turns on power relay RYp. Due to this, a discharging path is formed between both ends of second battery pack 10*b*, and a discharging current flows through second battery pack 10*b*.

Vehicle controller 32 controls on or off of discharging switch SWd according to a discharging pattern corresponding to the vehicle ID. Battery controller 12 of second battery pack 10*b* reads the discharging pattern from the current value detected by current sensor 17 and acquires the vehicle ID. With such control of the discharging current, the vehicle ID is written from vehicle controller 32 to battery controller 12 of second battery pack 10*b* (P2G). Battery controller 12 of second battery pack 10*b* broadcasts the discharging pattern corresponding to the read vehicle ID to vehicle controller 32 by the near-field communication. The communication pulse signal forming the discharging pattern to be transmitted to vehicle controller 32 is generated by granting a resistance measurement communication pulse having a width longer than the width of an identification information communication pulse to the identification information communication pulse forming a current pattern according to the identification information, similarly to the communication pulse used between controller 22 of charging device 20 and battery controller 12 of battery pack 10.

During the period where the discharging current including the discharging pattern corresponding to the vehicle ID flows, vehicle controller 32 measures the voltage of the power line on vehicle 30 side by voltage sensor 34, and measures the current flowing through the discharging path by current sensor 37 (P2I). During the period where the discharging current including the discharging pattern corresponding to the vehicle ID flows, battery controller 12 of second battery pack 10*b* measures the voltage of the power line on second battery pack 10*b* side by voltage measurer 14 (P2H).

Upon receiving a signal including a discharging pattern from battery controller 12 of second battery pack 10*b*, vehicle controller 32 collates the vehicle ID indicated by the received discharging pattern with the vehicle ID previously transferred via wire (P2J). Vehicle controller 32 broadcasts the collation result to battery controller 12 of second battery pack 10*b* by the near-field communication. When the collation fails, vehicle controller 32 disconnects the temporary connection with battery controller 12 of second battery pack 10b, and resumes scanning of the advertising packet after a predetermined time elapses. Battery controller 12 of second battery pack 10b disconnects the temporary connection with vehicle controller 32, and resumes the advertising of the near-field communication. In the case of successful collation, pairing between vehicle controller 32 and battery controller 12 of second battery pack 10b is completed (P2K and P2L).

When the pairing is completed, battery controller 12 of second battery pack 10b broadcasts the voltage of the power line on second battery pack 10b side having been measured to vehicle controller 32 by the near-field communication. Controller 22 of charging device 20 measures the contact resistance between vehicle 30 and second battery pack 10b based on the voltage of the power line of second battery pack 10b having been received, the voltage of the power line of vehicle 30 side having been measured, and the current of the discharging path having been measured (P2M). At that time, vehicle controller 32 desirably adopts, as a formal value of the contact resistance, a value in a state where the value of the contact resistance having been measured has converged.

Vehicle controller 32 compares the measured contact resistance with a threshold set in advance by a designer (P2N). When the measured contact resistance exceeds the threshold, vehicle controller 32 controls discharging switch SWd and first slot relay RYsa to be turned off. Vehicle controller 32 displays, on instrument panel 39, warning information indicating mounting failure of second battery pack 10b. When a speaker (not illustrated) is installed in vehicle 30, vehicle controller 32 may output, by audio from the speaker, warning information indicating mounting failure of second battery pack 10b.

When the measured contact resistance exceeds the threshold, vehicle controller 32 may notify a warning message including a coping method using at least one of a character and audio. At that time, vehicle controller 32 may notify a different coping method depending on the deviation degree between the measured contact resistance and the threshold. For example, when the deviation degree is smaller than a set value, vehicle controller 32 may notify a message prompting to remove second battery pack 10b once and remount second battery pack 10b. When the deviation degree is larger than the set value, vehicle controller 32 may notify a message prompting to remove second battery pack 10b and exchange it with another battery pack 10.

When the mounting failure is not eliminated even if the user exchanges battery pack with another battery pack 10, it is estimated that there is a cause of the contact failure in the terminal part of first mounting slot SLa1 of vehicle 30, and therefore, vehicle controller 32 may notify a message prompting inspection and repair of first mounting slot SLa1 of vehicle 30.

When the measured contact resistance exceeds the threshold, vehicle controller 32 may connect to charging device 20 by near-field communication and cause at least one of display unit 27 of charging device 20 and a speaker (not illustrated) to notify a warning message indicating mounting failure of second battery pack 10b. When the measured contact resistance exceeds the threshold, vehicle controller 32 may connect to a smartphone possessed by the user by near-field communication and cause at least one of a display (not illustrated) and a speaker (not illustrated) of charging device 20 to notify a warning message indicating mounting failure of second battery pack 10b. When the measured contact resistance does not exceed the threshold, no warning message is notified.

After the pairing between vehicle controller 32 and battery controller 12 of second battery pack 10b is completed, vehicle controller 32 broadcasts a shutdown instruction to battery controller 12 of second battery pack 10b by the near-field communication. Upon receiving the shutdown instruction from vehicle controller 32, battery controller 12 of second battery pack 10b is shut down (P2O).

Figure 9:
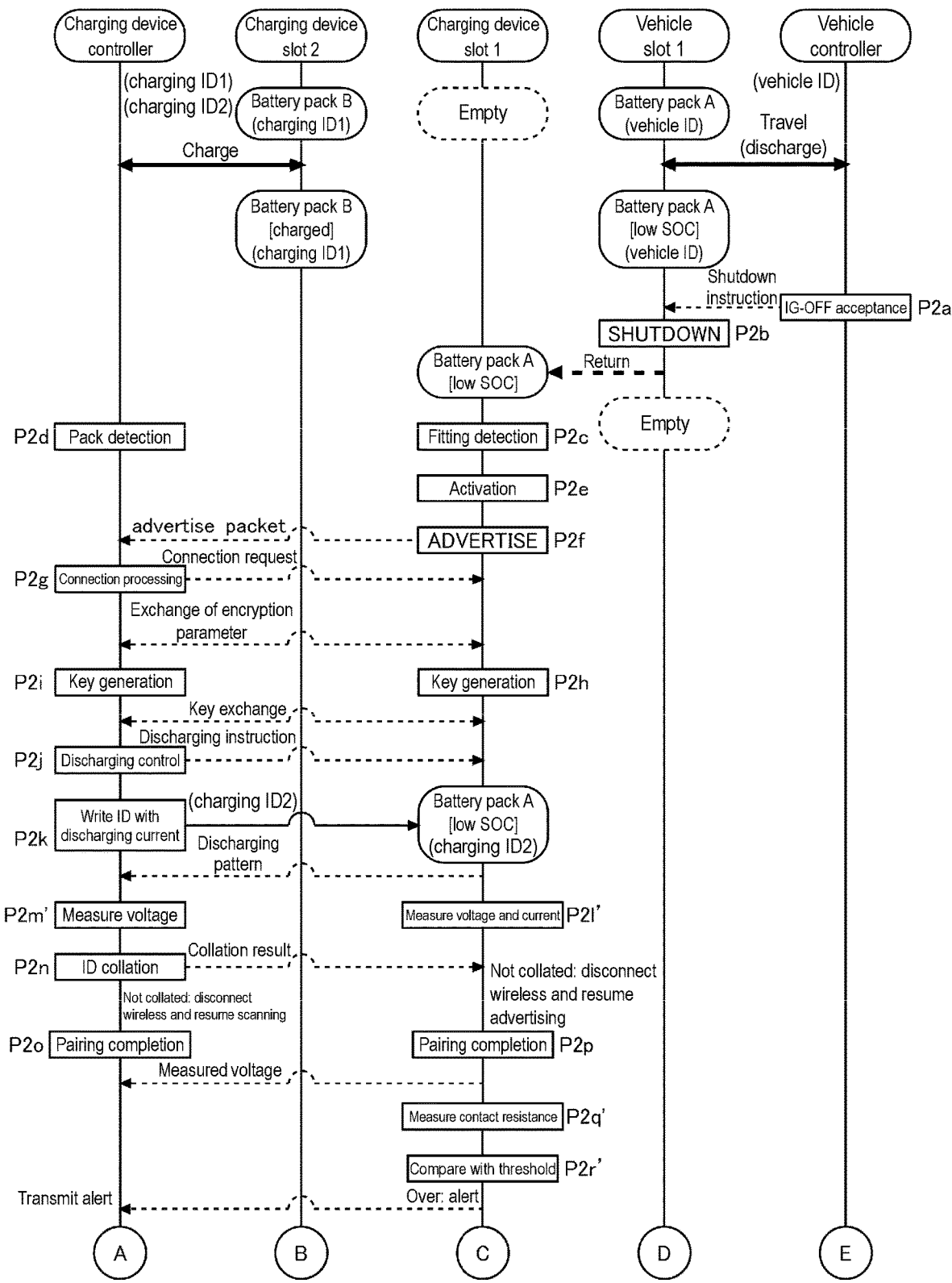
FIG. 9 is a sequence diagram illustrating a flow of processing according to a modified example of the processing illustrated in FIG. 7 (part 1).
Figure 10:
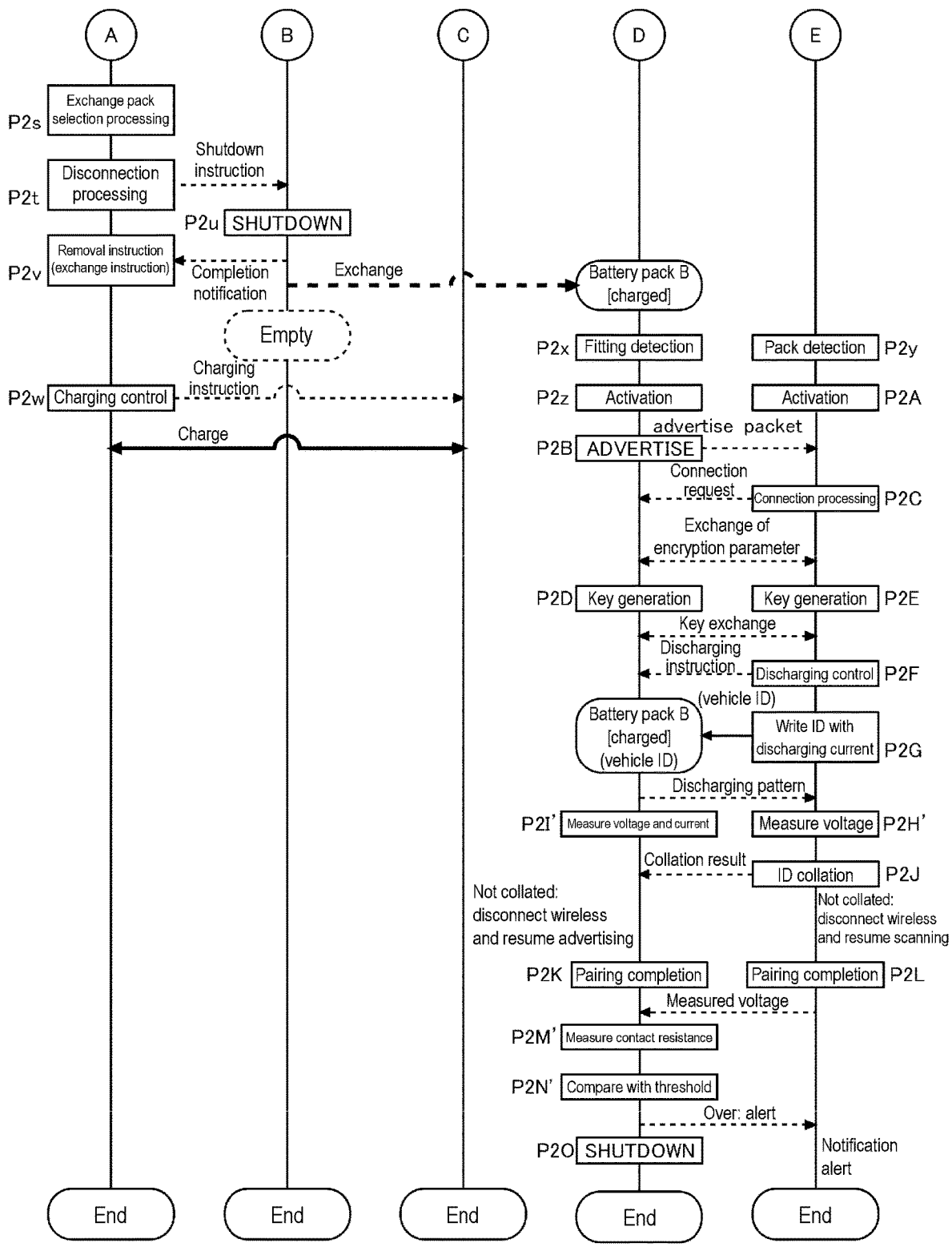
FIG. 10 is a sequence diagram illustrating a flow of processing according to a modified example of the processing illustrated in FIG. 8 (part 2).

FIG. 9 is a sequence diagram illustrating the flow of processing according to a modified example of the processing illustrated in FIG. 7 (part 1). FIG. 10 is a sequence diagram illustrating the flow of processing according to a modified example of the processing illustrated in FIG. 8 (part 2). Hereinafter, differences from the processing illustrated in FIGS. 7 and 8 will be described.

In the modified example, during the period where the discharging current including the discharging pattern according to charging ID2 flows, controller 22 of charging device 20 measures the voltage of the power line on charging device 20 side by the voltage sensor of charging device 20 (P2m'). During the period where the discharging current including the discharging pattern according to charging ID2 flows, battery controller 12 of first battery pack 10a measures the voltage of the power line on first battery pack 10a side by voltage measurer 14, and measures the current flowing through the discharging path by current sensor 17 (P2l').

In the modified example, when the pairing between controller 22 of charging device 20 and battery controller 12 of first battery pack 10a is completed, controller 22 of charging device 20 broadcasts the voltage of the power line of charging device 20 having been measured to battery controller 12 of first battery pack 10a by the near-field communication. Battery controller 12 of first battery pack 10a measures the contact resistance between charging device 20 and first battery pack 10a based on the voltage of the power line on charging device 20 side having been received, the voltage of the power line on first battery pack 10a side having been measured, and the current of the discharging path having been measured (P2q'). At that time, battery controller 12 of first battery pack 10a desirably adopts, as a formal value of the contact resistance, a value in a state where the value of the contact resistance having been measured has converged.

Battery controller 12 of first battery pack 10a compares the measured contact resistance with a threshold set in advance by a designer (P2r'). When the measured contact resistance exceeds the threshold, battery controller 12 of first battery pack 10a controls power relay RYp to be turned off. Battery controller 12 of first battery pack 10a broadcasts an alert signal indicating contact failure between first battery pack 10a and charging device 20 to controller 22 of charging device 20 by the near-field communication. Upon receiving the alert signal, controller 22 of charging device 20 transmits an alert signal to a terminal device (not illustrated) of a manager of charging device 20.

In the modified example, during the period where the discharging current including the discharging pattern according to the vehicle ID flows, vehicle controller 32 measures the voltage of the power line on vehicle 30 side by voltage sensor 34 (P2H'). During the period where the discharging current including the discharging pattern corresponding to the vehicle ID flows, battery controller 12 of second battery pack 10b measures the voltage of the power line on second battery pack 10b side by voltage measurer 14, and measures the current flowing through the discharging path by current sensor 17 (P2I').

In the modified example, when the pairing between vehicle controller 32 and battery controller 12 of second battery pack 10b is completed, vehicle controller 32 broadcasts the voltage of the power line on vehicle 30 side having been measured to battery controller 12 of second battery pack 10b by the near-field communication. Battery controller 12 of second battery pack 10b measures the contact resistance between vehicle 30 and second battery pack 10b based on the voltage of the power line on vehicle 30 side having been received, the voltage of the power line on second battery pack 10b side having been measured, and the current of the discharging path having been measured (P2M'). At that time, vehicle controller 32 desirably adopts, as a formal value of the contact resistance, a value in a state where the value of the contact resistance having been measured has converged.

Battery controller 12 of second battery pack 10b compares the measured contact resistance with a threshold set in advance by a designer (P2N'). When the measured contact resistance exceeds the threshold, battery controller 12 of second battery pack 10b controls power relay RYp to be turned off. Battery controller 12 of second battery pack 10b broadcasts an alert signal indicating contact failure between second battery pack 10b and vehicle 30 to vehicle controller 32 by the near-field communication. Upon receiving the alert signal, vehicle controller 32 displays, on instrument panel 39, warning information indicating mounting failure of second battery pack 10b. When a speaker (not illustrated) is installed in vehicle 30, vehicle controller 32 may output, by audio from the speaker, warning information indicating mounting failure of second battery pack 10b.

As described above, in the present exemplary embodiment, ID is written from vehicle 30 or charging device 20 to battery pack 10 via wire, and the ID is looped back from battery pack 10 to vehicle 30 or charging device 20 by the near-field communication. Due to this, vehicle 30 or charging device 20 that controls battery pack 10 by using the near-field communication can correctly identify mounted battery pack 10. There is no longer malfunctions such as erroneous control of battery pack 10 mounted in another nearby vehicle 30 by vehicle controller 32 of certain vehicle 30, and the safety and security of entire vehicle system 1 using charging device 20 and exchangeable battery pack 10 can be secured. The user can cause vehicle 30 to safely travel only by taking out battery pack 10 mounted into charging device 20 and mounting the battery pack in vehicle 30.

The number of pins included in the connector of battery pack 10 can be reduced by performing, by the near-field communication, transmission and reception of control signals between vehicle 30 or charging device 20 and battery pack 10. This makes it possible to reduce mechanical connection failure between vehicle 30 or charging device 20 and battery pack 10. The firmware used in battery controller 12 of battery pack 10 can be updated via wireless communication, and update of the firmware becomes easy.

In the present exemplary embodiment, in the authentication process using the current pattern flowing through the power line, the contact resistance is measured based on a differential voltage between battery pack 10 and vehicle 30 or charging device 20 and the current flowing through the power line. This enables the abnormality determination of the contact resistance to be completed in the authentication process.

Normally, measurement of contact resistance is carried out in a charging and discharging process following the authentication process. On the other hand, in the present exemplary embodiment, contact resistance is measured in the authentication process. Due to this, when the contact resistance is normal, charging and discharging can be started more quickly. When the contact resistance is abnormal, the user can be notified of the contact failure of battery pack 10 more quickly. In the case of a slight contact failure, the contact failure can be eliminated by prompting the user to remount. In the case of a severe contact failure, it is possible to prevent the occurrence of an unsafe event due to heat generation accompanying charge and discharge by interrupting the current flow.

Thus, by measuring the contact resistance in the authentication process, it is possible to reduce the number of steps in the authentication process and the entire charging and discharging process, and it is possible to shorten the authentication process and the entire charging and discharging process. In a case where the user manually moves vehicle 30 from the front of charging device 20 during the period between the authentication process and the charging and discharging process, in the method of measuring the contact resistance during the charging and discharging process, even if contact failure is detected, the battery pack cannot be immediately exchanged with another battery pack 10. On the other hand, in the present exemplary embodiment, since contact resistance is measured during the authentication process, the user can grasp the presence or absence of contact failure simultaneously with mounting of battery pack 10. Therefore, user convenience is improved.

The present disclosure has been described above based on the exemplary embodiment. It is to be understood by the person of ordinary skill in the art that the exemplary embodiment is an example, that combinations of its configuration elements and processing processes can have various modified examples, and that such modified examples are also within the scope of the present disclosure.

For example, an offset error between voltage measurer 14 of battery pack 10 and the voltage sensor of charging device 20 or voltage sensor 34 of vehicle 30 may be measured before the discharging current flows. The offset error may be calculated on battery controller 12 side or may be measured on controller 22 of charging device 20 or vehicle controller 32 side. When calculating contact resistance, battery controller 12, controller 22 of charging device 20, or vehicle controller 32 corrects differential voltage $\Delta V=(VB-VA)$ in (Formula 1) with the offset error. This allows the measurement accuracy of contact resistance to be improved.

In the above-described exemplary embodiment, an example of using battery pack 10 incorporating battery module 11 including the lithium ion battery cell, the nickel hydrogen battery cell, and the lead battery cell has been described. In this regard, a capacitor pack incorporating a capacitor module including an electric double layer capacitor cell and a lithium ion capacitor cell may be used. In this description, a battery pack and a capacitor pack are collectively called a power storage pack.

In the above-described exemplary embodiment, an electric motorcycle (electric scooter) is assumed as vehicle 30 using exchangeable battery pack 10 as a power source. In this regard, vehicle 30 may be an electric bicycle. Vehicle 30 may be a four-wheeled electric vehicle (EV). The electric vehicles include not only full-standard electric vehicles but also low-speed electric vehicles such as golf carts and golf cars used in shopping malls and entertainment facilities.

An electric moving body using exchangeable battery pack 10 as a power source is not limited to vehicle 30. For example, the electric moving bodies also include electric ships. For example, a power source of a water bus or a water taxi may be exchangeable battery pack 10. The electric moving bodies also include trains. For example, a train equipped with exchangeable battery pack 10 can be used instead of a diesel train used in a non-electrified railway line. The electric moving bodies also include electric flying objects. The electric flight objects include multicopters (drones). The multicopters include so-called flying cars. Any electric moving body can shorten an energy supply time.

The exemplary embodiment may be specified by the following items.

[Item 1]

Power storage pack (10) including: power storage unit (11) for feeding power to electric moving body (30); and controller (12) that performs communication for authentication according to a pattern of a current flowing through a power line with controller (32) of electric moving body (30) in a state where power storage pack (10) is mounted to electric moving body (30), in which controller (12) of power storage pack (10) measures contact resistance between power storage pack (10) and electric moving body (30) based on voltage of the power line on power storage pack (10) side, voltage of the power line on electric moving body (30) side received from controller (32) of electric moving body (30), and current when communication for authentication is performed according to a pattern of current flowing through the power line.

This makes it possible to efficiently measure contact resistance at the time of mounting power storage pack (10).

[Item 2]

Power storage pack (10) according to Item 5, in which a communication signal for communicating between controller (12) of power storage pack (10) and controller (32) of electric moving body (30) when communication for the authentication is performed is generated by a pulse signal based on a pattern of a current flowing through the power line, the pulse signal includes an identification information communication pulse of a current pattern according to identification information for authentication and a resistance measurement communication pulse having a width longer than a width of the identification information communication pulse, and the contact resistance is measured by the resistance measurement communication pulse signal.

This makes it possible to improve measurement accuracy of contact resistance.

[Item 3]

Power storage pack (10) according to Item 1 or 2, in which controller (12) of power storage pack (10) transmits a signal for notifying presence of power storage pack (10) itself by near-field communication when power storage pack (10) is mounted to electric moving body (30), receives, by a pattern of a current flowing through the power line, identification information transmitted from controller (32) of electric moving body (30) after being temporarily connected to controller (32) of electric moving body (30), and transmits a signal including the identification information to controller (32) of electric moving body (30) by the near-field communication when receiving the identification information from controller (32) of electric moving body (30), a signal transmitted by the near-field communication is used by controller (32) of electric moving body (30) to authenticate whether or not power storage pack (10) mounted in electric moving body (30) and a communication partner of the near-field communication are identical, and controller (12) of power storage pack (10) measures the contact resistance during the authentication process.

This makes it possible for controller (32) of electric moving body (30) to accurately authenticate whether or not mounted power storage pack (10) and the communication partner of the near-field communication are identical.

[Item 4]

Power storage pack (10) according to any one of Items 1 to 3, in which controller (12) of power storage pack (10) transmits an alert signal to controller (32) of electric moving body (30) when measured contact resistance exceeds a threshold.

This makes it possible to cause controller (32) of electric moving body (30) to recognize contact failure.

[Item 5]

Power storage pack (10) including: power storage unit (11) for feeding power to electric moving body (30); and controller (12) that performs communication for authentication according to a pattern of a current flowing through a power line with controller (22) of charging device (20) in a state where power storage pack (10) is mounted to charging slot (SLc1) of charging device (20), in which controller (12) of power storage pack (10) measures contact resistance between power storage pack (10) and charging device (20) based on voltage of the power line on power storage pack (10) side, voltage of a power line on charging device (20) side received from controller (22) of charging device (20), and current when communication for authentication is performed according to a pattern of current flowing through the power line.

This makes it possible to efficiently measure contact resistance at the time of mounting power storage pack (10).

[Item 6]

Power storage pack (10) according to Item 5, in which a communication signal for communicating between controller (12) of power storage pack (10) and controller (22) of charging device (20) when communication for the authentication is performed is generated by a pulse signal based on a pattern of a current flowing through the power line, the pulse signal includes an identification information communication pulse of a current pattern according to identification information for authentication and a resistance measurement communication pulse having a width longer than a width of the identification information communication pulse, and the contact resistance is measured by the resistance measurement communication pulse signal.

This makes it possible to improve measurement accuracy of contact resistance.

[Item 7]

Power storage pack (10) according to Item 5 or 6, in which controller (12) of power storage pack (10) transmits a signal for notifying presence of power storage pack (10) itself by near-field communication when power storage pack (10) is mounted in charging slot (SLc1) of charging device (20), receives, by a pattern of a current flowing through the power line, identification information transmitted from controller (22) of charging device (20) after being temporarily connected to controller (22) of charging device (20), and transmits a signal including the identification information to controller (22) of charging device (20) by the near-field communication when receiving the identification information from controller (22) of charging device (20), a signal transmitted by the near-field communication is used by controller (22) of charging device (20) to authenticate whether or not power storage pack (10) mounted in charging slot (SLc1) of charging device (20) and a communication partner of the near-field communication are identical, and controller (12) of power storage pack (10) measures the contact resistance during the authentication process.

This makes it possible for controller (22) of charging device (20) to accurately authenticate whether or not power storage pack (10) mounted into charging slot (SLc1) and the communication partner of the near-field communication are identical.

[Item 8]

The power storage pack (10) according to any one of Items 5 to 7, in which controller (12) of power storage pack (10) transmits an alert signal to controller (22) of charging device (20) when a value of contact resistance having been measured exceeds a threshold.

This allows controller (22) of charging device (20) to recognize contact failure.

[Item 9]

Power storage pack (10) according to any one of Items 1 to 8, in which controller (12) of power storage pack (10) sets, as an official contact resistance value, a value in a state where a value of contact resistance having been measured has converged.

This makes it possible to improve measurement accuracy of contact resistance.

[Item 10]

Electric moving body (30) including: motor (311); and controller (32) that performs communication for authentication with controller (12) of power storage pack (10) according to a pattern of a current flowing through a power line in a state where power storage pack (10) for feeding power to motor (311) is mounted to electric moving body (30), in which controller (32) of electric moving body (30) measures contact resistance between electric moving body (30) and power storage pack (10) based on voltage of the power line on electric moving body (30) side, voltage of the power line on power storage pack (10) side received from controller (12) of power storage pack (10), and current when communication for authentication is performed according to a pattern of current flowing through the power line.

This makes it possible to efficiently measure contact resistance at the time of mounting power storage pack (10).

[Item 11]

Electric moving body (30) according to Item 10, in which controller (32) of electric moving body (30) is temporarily connected to a controller of a transmission destination of a signal when receiving the signal transmitted by near-field communication after power storage pack (10) is mounted to electric moving body (30), transmits, to controller (12) of power storage pack (10) mounted to electric moving body (30), identification information according to a pattern of a current flowing through the power line, when receiving a signal transmitted by the near-field communication from controller (12) of temporarily connected power storage pack (10), collates whether or not identification information included in a received signal matches identification information transmitted according to a pattern of a current flowing through the power line, and when matches, authenticates that power storage pack (10) mounted to electric moving body (30) and a communication partner of the near-field communication are identical, and measures the contact resistance during the authentication process.

This makes it possible for controller (32) of electric moving body (30) to accurately authenticate whether or not mounted power storage pack (10) and the communication partner of the near-field communication are identical.

[Item 12]

Electric moving body (30) according to Item 10 or 11 further including: notification unit (39) for notifying information indicating a state of electric moving body (30), in which when measured contact resistance exceeds a threshold, controller (32) of electric moving body (30) causes notification unit (39) to notify information indicating mounting failure of power storage pack (10).

This can cause the user to recognize contact failure.

[Item 13]

Electric moving body (30) according to any one of Items 10 to 12, in which controller (32) of electric moving body (30) sets, as a formal value of contact resistance, a value in a state where a value of contact resistance having been measured has converged.

This makes it possible to improve measurement accuracy of contact resistance.

[Item 14]

Charging device (20) including: charging slot (SLc1); and controller (22) that performs communication for authentication with controller (12) of power storage pack (10) according to a pattern of a current flowing through a power line in a state where power storage pack (10) is mounted into charging slot (SLc1), in which controller (22) of charging device (20) measures contact resistance between charging device (20) and power storage pack (10) based on voltage of the power line on charging device (20) side, voltage of the power line on power storage pack (10) side received from controller (12) of power storage pack (10), and current when communication for authentication is performed according to a pattern of current flowing through the power line.

This makes it possible to efficiently measure contact resistance at the time of mounting power storage pack (10).

[Item 15]

Charging device (20) according to Item 14, in which controller (22) of charging device (20) is temporarily connected to a controller of a transmission destination of a signal when receiving the signal transmitted by near-field communication after power storage pack (10) is mounted to charging slot (SLc1), transmits, to controller (12) of power storage pack (10) mounted to charging slot (SLc1), identification information according to a pattern of a current flowing through the power line, when receiving a signal transmitted by the near-field communication from controller (12) of temporarily connected power storage pack (10), collates whether or not identification information included in a received signal matches identification information transmitted according to a pattern of a current flowing through the power line, and when matches, authenticates that power storage pack (10) mounted to charging slot (SLc1) and a communication partner of the near-field communication are identical, and measures the contact resistance during the authentication process.

This makes it possible for controller (22) of charging device (20) to accurately authenticate whether or not power storage pack (10) mounted into charging slot (SLc1) and the communication partner of the near-field communication are identical.

[Item 16]

Charging device (20) according to Item 14 or 15, in which controller (22) of charging device (20) transmits an alert signal to a terminal device of a manager of charging device (20) when measured contact resistance exceeds a threshold.

This can cause the manager of charging device (20) to recognize contact failure.

[Item 17]

Charging device (20) according to any one of Items 14 to 16, in which controller (22) of charging device (20) sets, as a formal value of formal contact resistance, a value in a state where a value of contact resistance having been measured has converged.

This makes it possible to improve measurement accuracy of contact resistance.

REFERENCE MARKS IN THE DRAWINGS

1: vehicle system
2: commercial power system
10: battery pack
11: battery module
E1-En: cell
12: battery controller
13: processor
14: voltage measurer
15: antenna
16: wireless communication unit
17: current sensor
18: fitting detector
20: charging device
21: charging stand
SLc: charging slot
22: controller
23: processor
25: antenna
26: wireless communication unit
27: display unit
28: operation unit
29: charging unit
30: vehicle
31: battery mounting unit
SLa: mounting slot
32: vehicle controller
33: processor
33r: relay controller
34: voltage sensor
35: antenna
36: wireless communication unit
37: current sensor
38a: first fitting detector
38b: second fitting detector
38p: pack detector
39: instrument panel
310: inverter
311: motor
312: tire
RYm: main relay
RYs: slot relay
RYp: power relay
SWd: discharging switch
F1: fuse
R1: resistor
Tp: positive-electrode terminal
Tm: negative-electrode terminal

The invention claimed is:

1. A power storage pack comprising:
a power storage unit for supplying power to an electric moving body; and
a controller that performs communication for authentication according to a pattern of a current flowing through a power line with a controller of the electric moving body in a state where the power storage pack is mounted to the electric moving body,
wherein the controller of the power storage pack measures contact resistance between the power storage pack and the electric moving body based on voltage of the power line on the power storage pack side, voltage of the power line on the electric moving body side received from the controller of the electric moving body, and current when communication for authentication is performed according to a pattern of current flowing through the power line.

2. The power storage pack according to claim 1, wherein a communication signal for communicating between the controller of the power storage pack and the controller of the electric moving body when communication for the authentication is performed is generated by a pulse signal based on a pattern of a current flowing through the power line,
the pulse signal includes an identification information communication pulse of a current pattern according to identification information for authentication and a resistance measurement communication pulse including a width longer than a width of the identification information communication pulse, and
the contact resistance is measured by the resistance measurement communication pulse signal.

3. The power storage pack according to claim 1, wherein the controller of the power storage pack
broadcasts a signal for notifying presence of the power storage pack itself by near-field communication when the power storage pack is mounted to the electric moving body,
receives, by a pattern of a current flowing through the power line, identification information transmitted from the controller of the electric moving body after being temporarily connected to the controller of the electric moving body, and
broadcasts a signal including the identification information to the controller of the electric moving body by the near-field communication when receiving the identification information from the controller of the electric moving body,
the signal broadcasted by the near-field communication is used by the controller of the electric moving body to authenticate whether or not the power storage pack mounted in the electric moving body and a communication partner of the near-field communication are identical, and
the controller of the power storage pack measures the contact resistance during the authentication process.

4. The power storage pack according to claim 1, wherein the controller of the power storage pack transmits an alert signal to the controller of the electric moving body when measured contact resistance exceeds a threshold.

5. A power storage pack comprising:
a power storage unit for supplying power to an electric moving body; and
a controller that performs communication for authentication according to a pattern of a current flowing through a power line with a controller of a charging device in a state where the power storage pack is mounted to a charging slot of the charging device,
wherein the controller of the power storage pack measures contact resistance between the power storage pack and the charging device based on voltage of the power line on the power storage pack side, voltage of a power line on the charging device side received from the controller of the charging device, and current when communication for authentication is performed according to a pattern of current flowing through the power line.

6. The power storage pack according to claim 5, wherein a communication signal for communicating between the controller of the power storage pack and the controller of the charging device when communication for the authentication is performed is generated by a pulse signal based on a pattern of a current flowing through the power line, the pulse signal includes an identification information communication pulse of a current pattern according to identification information for authentication and a resistance measurement communication pulse including a width longer than a width of the identification information communication pulse, and the contact resistance is measured by the resistance measurement communication pulse signal.

7. The power storage pack according to claim 5, wherein the controller of the power storage pack broadcasts a signal for notifying presence of the power storage pack itself by near-field communication when the power storage pack is mounted in the charging slot of the charging device, receives, by a pattern of a current flowing through the power line, identification information transmitted from the controller of the charging device after being temporarily connected to the controller of the charging device, and broadcasts a signal including the identification information to the controller of the charging device by the near-field communication when receiving the identification information from the controller of the charging device, the signal broadcasted by the near-field communication is used by the controller of the charging device to authenticate whether or not the power storage pack mounted in the charging slot of the charging device and a communication partner of the near-field communication are identical, and the controller of the power storage pack measures the contact resistance during the authentication process.

8. The power storage pack according to claim 5, wherein the controller of the power storage pack transmits an alert signal to the controller of the charging device when a value of contact resistance measured exceeds a threshold.

9. The power storage pack according to claim 1, wherein the controller of the power storage pack sets, as a formal value of contact resistance, a value in a state where a value of contact resistance measured, the value converged.

10. An electric moving body comprising:

a motor; and a controller that performs communication for authentication with a controller of a power storage pack according to a pattern of a current flowing through a power line in a state where the power storage pack for supplying power to the motor is mounted to the electric moving body, wherein the controller of the electric moving body measures contact resistance between the electric moving body and the power storage pack based on voltage of the power line on the electric moving body side, voltage of the power line on the power storage pack side received from a controller of the power storage pack, and current when communication for authentication is performed according to a pattern of current flowing through the power line.

11. The electric moving body according to claim 10, wherein the controller of the electric moving body is temporarily connected to a controller of a transmission destination of a signal when receiving the signal broadcasted by near-field communication after the power storage pack is mounted to the electric moving body, transmits, to the controller of the power storage pack mounted to the electric moving body, identification information according to a pattern of a current flowing through the power line, when receiving a signal broadcasted by the near-field communication from the controller of the power storage pack, the controller temporarily connected collates whether or not identification information included in the signal received matches identification information transmitted according to a pattern of a current flowing through the power line, and when matches, authenticates that the power storage pack mounted to the electric moving body and a communication partner of the near-field communication are identical, and measures the contact resistance during the authentication process.

12. The electric moving body according to claim 10, further comprising a notification unit for notifying information indicating a state of the electric moving body, wherein when measured contact resistance exceeds a threshold, the controller of the electric moving body causes the notification unit to notify information indicating mounting failure of the power storage pack.

13. The electric moving body according to claim 10, wherein the controller of the electric moving body sets, as a formal value of contact resistance, a value in a state where a value of contact resistance measured, the value converged.

14. A charging device comprising:

a charging slot; and a controller that performs communication for authentication with a controller of a power storage pack according to a pattern of a current flowing through a power line in a state where a power storage pack is mounted into the charging slot, wherein the controller of the charging device measures contact resistance between the charging device and the power storage pack based on voltage of the power line on the charging device side, voltage of the power line on the power storage pack side received from the controller of the power storage pack, and current when communication for authentication is performed according to a pattern of current flowing through the power line.

15. The charging device according to claim 14, wherein the controller of the charging device is temporarily connected to a controller of a transmission destination of a signal when receiving the signal broadcasted by near-field communication after the power storage pack is mounted to the charging slot, transmits, to the controller of the power storage pack mounted to the charging slot, identification information according to a pattern of a current flowing through the power line, when receiving a signal broadcasted by the near-field communication from the controller of the power storage pack, the controller temporarily connected collates whether or not identification information included in the signal received matches identification information transmitted according to a pattern of a current flowing through the power line, and when matches, authenticates that the power storage pack mounted to the electric moving body and a communication partner of the near-field communication are identical, and measures the contact resistance during the authentication process.

16. The charging device according to claim 14, wherein the controller of the charging device transmits an alert signal to a terminal device of a manager of the charging device when measured contact resistance exceeds a threshold.

17. The charging device according to claim 14, wherein the controller of the charging device sets, as a formal value of formal contact resistance, a value in a state where a value of contact resistance measured, the value converged.

* * * * *